(12) United States Patent
Mukunoki

(10) Patent No.: US 7,602,638 B2
(45) Date of Patent: Oct. 13, 2009

(54) SEMICONDUCTOR MEMORY DEVICE

(75) Inventor: Toshio Mukunoki, Nara (JP)

(73) Assignee: Panasonic Corporation, Osaka (JP)

( * ) Notice: Subject to any disclaimer, the term of this patent is extended or adjusted under 35 U.S.C. 154(b) by 128 days.

(21) Appl. No.: 11/398,770

(22) Filed: Apr. 6, 2006

(65) Prior Publication Data

US 2006/0258100 A1 Nov. 16, 2006

(30) Foreign Application Priority Data

Apr. 7, 2005 (JP) .............................. 2005-111351

(51) Int. Cl.
*G11C 11/34* (2006.01)
(52) U.S. Cl. ................... 365/185.03; 365/200; 365/19; 365/226; 257/288; 257/E29.266; 257/E29.324
(58) Field of Classification Search ................ 257/288, 257/351, E29.324, E29.226; 365/158, 171, 365/185, 185.03, 19, 200, 226; 370/395
See application file for complete search history.

(56) References Cited

U.S. PATENT DOCUMENTS 4,224,686 A 9/1980 Aneshansley
5,815,433 A 9/1998 Takeuchi
6,657,891 B1 * 12/2003 Shibata et al. ......... 365/185.03
2004/0004856 A1 * 1/2004 Sakimura et al. ............ 365/158

FOREIGN PATENT DOCUMENTS

JP 05-040702 2/1993

* cited by examiner

*Primary Examiner*—Cuong Q Nguyen
*Assistant Examiner*—Cathy N Lam
(74) *Attorney, Agent, or Firm*—McDermott Will & Emery LLP

(57) ABSTRACT

A semiconductor memory device is provided which can achieve high performance, such as an improvement in reliability, an improvement in yield, and the like, without increasing the chip area. The semiconductor memory device is a non-volatile semiconductor memory device operable to program and erase data, and hold the data in the absence of a supplied voltage, comprising a memory cell including a first charge localized portion and a second charge localized portion each operable to store static charge corresponding to the data. The second charge localized portion stores static charge corresponding to static charge which should be stored in the first charge localized portion, thereby serving as a backup to the first charge localized portion.

3 Claims, 17 Drawing Sheets

SEMICONDUCTOR MEMORY DEVICE

BACKGROUND OF THE INVENTION

1. Field of the Invention

The present invention relates to a semiconductor memory device which can hold data during the time when a voltage is not supplied, such as a flash EEPROM (Electronically Erasable and Programmable Read Only Memory) or the like. More particularly, the present invention relates to a semiconductor memory device including a memory cell capable of storing a plurality of data values per cell (multiple bits/cell), such as an MNOS (Metal Nitride Oxide Semiconductor) memory cell.

2. Description of the Background Art

Semiconductor memory devices in which elements are integrated on a semiconductor substrate and data is stored are roughly divided into two type: a volatile semiconductor memory device capable of holding data only during the time when a voltage is supplied; and a semiconductor memory device capable of holding data even during the time when a voltage is not supplied. The two types of semiconductor memory devices are further divided into a plurality of types, depending on the system or the usage.

One of the latter semiconductor memory devices that is most widely used at the present time is a flash EEPROM which allows data to be electrically programmed or erased. A type of flash EEPROM has currently become the mainstream, which has a floating memory cell in which a floating gate whose surface is insulated with oxide film or the like is formed on a channel of a MOS (Metal Oxide Semiconductor) transistor. In the floating memory cell, data is stored by injecting or extracting electrons to/from the floating gate to change a gate voltage threshold value (hereinafter referred to as Vt) at which a source-drain current starts flowing in the MOS transistor.

On the other hand, in recent years, the limelight is shifting again to an MNOS memory cell. Unlike the floating memory cell, the MNOS memory cell has an ONO film formed on the channel of the MOS transistor, and Vt is changed by injecting electrons or holes into a trap of an ONO film interface. The MNOS memory cell is characterized in that trapped static charge (electrons or holes) cannot substantially move. Therefore, in the MNOS memory cell, even if there is an oxide film defect as in the floating memory cell, not all static charge stored therein is extracted. Such a feature possessed by the MNOS memory cell is advantageous with respect to data loss over time (retention problem) which has become more serious in recent years as the thickness of the oxide film is reduced.

In the MNOS memory cell, since the injected static charge does not move, the static charge can be localized on the channel. Generally, the injection of static charge occurs in the vicinity of the drain where hot electrons are generated. Therefore, in the MNOS memory cell, the static charge is localized on the ON film interface in the vicinity of the drain. The source and drain of the MNOS memory cell are determined, depending on a bias condition, and therefore, the bias condition between the source and the drain can be reversed during the time when the semiconductor memory device is used. Therefore, in the MNOS memory cell, two charge localized portions can be formed on both sizes of the channel of the memory cell. Therefore, in the MNOS memory cell, by assigning one piece of data to each of the two charge localized portions, two pieces of data can be stored in one cell. Because of such a feature, expectations are growing for the MNOS memory cell.

FIG. 15A is a cross-sectional diagram illustrating a general MNOS memory cell. In FIG. 15A, on a semiconductor substrate Sub, a LOCOS 101 for element isolation, an ONO film 102, and a gate 103, and a diffusion layer 104 and a diffusion layer 105 below the LOCOS 101, are formed. The gate 103 is generally formed of polysilicon, and when a memory array is configured, is used as a word line. The diffusion layer 104 and the diffusion layer 105 are each the drain or source of a memory cell, and when a memory array is configured, are used as buried bit lines. Charge localized portions 106 and 107 are portions where charge is localized.

FIG. 15B is a schematic diagram illustrating the MNOS memory cell of FIG. 15A. The same reference characters designate the same parts in FIGS. 15A and 15B. Note that, for the sake of simplicity, the gate 103, the diffusion layers 104 and 105 (one is a drain and the other is a source), and the charge localized portions 106 and 107 are indicated with symbols illustrated in FIG. 15B throughout all figures of the accompanying drawings.

FIG. 16 is a schematic diagram illustrating a memory array composed of conventional memory cells and its vicinity. Note that, in FIG. 16, although only a portion of the array is illustrated due to limitations of space, the actual array generally has more memory cells provided vertically and horizontally. As illustrated in FIG. 16, a plurality of memory cells M01 to M06 are arranged in an array extending horizontally in the figure. The gate of each memory cell is connected to a horizontally extending word line WL0 (common node). Specifically, the control gates of the memory cells M01 to M06 are connected to the word line WL0. The source or drain of each memory cell is connected to a corresponding one of vertically extending bit lines BL0 to BL6 (common nodes). For example, the drain or source of the memory cell M01 is connected to the bit line BL0 or BL1, respectively. The drain or source of the memory cell M02 is connected to the bit line BL1 or BL2, respectively.

Each bit line is selectively connected via a switch 108 to one of the inputs of a sense amplifier 109. The drain of a reference cell R01 is connected via a reference bit line RBL to the other input of the sense amplifier 109. The reference cell R01 may be a CMOS transistor which is designed so that a current having substantially a middle magnitude between a memory cell current when held data is 1 and a memory cell current when held data is 0 flows. The reference cell R01 has a source line RSL and a word line RWL. The gate of the reference cell R01 is connected to the word line RWL. An electrode of the reference cell R01 which is not connected to the sense amplifier 109 is a source, which is connected to the source line RSL.

In the case of the conventional example of FIG. 16, when a read operation is performed, a current of each of the memory cells M01 to M06 is compared with a current of the reference cell R01, and data stored in each of the memory cells M01 to M06 is determined, depending on the magnitude relationship of the currents. A memory cell, from which data is read out, is selected by switching the connection of the bit lines to the sense amplifier 109. In this case, when the bit lines are selected, care should be taken when determining from which of the two charge localized portions 106 and 107 of each memory cell data is to be read out.

For example, when static charge stored in the right-hand charge localized portion 107 of the memory cell M02 is read out, the bit line BL1 is connected to the sense amplifier 109, and the bit line BL2 is connected to a ground level. When data is read out from the left-hand charge localized portion 106, the bit line BL2 is connected to the sense amplifier 109, and the bit line BL1 is connected to the ground level. The bit line which is connected to the sense amplifier 109 is precharged to a Hi level immediately before a read operation. Specifically, by reversing the direction of a bias voltage applied to a bit line connected to a memory cell, the source and drain of the memory cell are switched to change the charge localized portions from which data is read.

As described above, two-bit data can be stored in and read from one cell. In some cases, one-bit data is stored in one cell, which may be advantageous in terms of characteristics, reliability, and cost of a product. In this case, a configuration has been proposed in which the opposite charge localized portion of the same cell is normally not used. For example, in the above-described example, only the charge localized portion 107 is used while the use of the charge localized portion 106 is abandoned, so that only one-bit data is stored in one cell. When this memory cell configuration is used, the memory capacity is reduced by half, but this configuration still has superiority over the floating type in terms of the retention problem or the like.

When the MNOS memory cell of FIG. 15A is used to hold one bit per cell, charge is injected into or extracted from only the charge localized portion 107 so as to store data, while charge is not injected into or extracted from the charge localized portion 106, for example. Therefore, the charge localized portion 106 is invariably in a neutral state. When a read operation is performed, a bit line which the switch 108 connects to the sense amplifier 109 in FIG. 16 is a bit line via which data is read out. The bit line used to read out data varies, depending on which of the charge localized portions is used to store data.

FIG. 17 is a schematic diagram illustrating a configuration of a conventional semiconductor memory device, such as a flash memory or the like. The conventional semiconductor memory device comprises memory sectors MS0 to MS3 which are normally used to store data, and a redundant memory sector MS4 which replaces a defective memory sector which occurs due to a problem during a production among the normally used memory sectors. Also, the conventional semiconductor memory device includes a row decoder 110 (X-DEC) which drives a word line common to all the memory sectors including the redundant memory sector MS4, and column decoders 111 to 115 (Y-DECs) and I/O circuits 116 to 120 which are independently provided in the respective memory sectors.

The memory sector is a unit including a group of memory cells. In the case of a flash memory, the memory sector is typically used as a group of memory cells which are simultaneously subjected to an erase operation. Alternatively, the memory sector may be a group of memory cells which have a source line, a bit line, or a word line in common. The row decoder 110 is a group of a decoder which selects one word line in accordance with a designated address and a driver which supplies a potential to the selected word line. Similarly, the column decoders 111 to 115 each select one bit line in accordance with a designated address. Specifically, the column decoder is a group of the switches 108 of FIG. 16. The I/O circuits 116 to 120 are each a circuit group of the sense amplifier 109 and the reference cell R01 of FIG. 16 and a driver and the like.

Next, a conventional redundant relief technique will be described with reference to FIG. 17. When a defective portion is found in the normally used memory sectors MS0 to MS3 during an inspection before shipment of a product, the inspected semiconductor memory device is a defective product if any restoration is not performed. Therefore, by replacing the function of the defective portion thus found with a previously prepared spare portion (redundant memory sector), the semiconductor memory device can be caused to be a non-defective product. This operation is called redundant relief.

For example, assuming that a defect occurs in a memory cell of the memory sector MS1, when the address of the memory sector MS1 is designated, the memory sector MS1 is disabled by changing an access destination to the redundant memory sector MS4. With the above-described configuration, even if a defective portion is present in the memory sector MS1, substantially no problem occurs in actual use, so that the semiconductor memory device can be shipped as a non-defective product (see Japanese Patent Laid-Open Publication No. 05-40702).

The smaller the units in which the redundant relief is performed, the smaller the area which is occupied by prepared redundant memories. Therefore, conventionally, the redundant relief may be performed in units of one word line or one bit line in DRAMs and the like. However, in non-volatile semiconductor memory devices, a defective memory cell often interfere with operations of non-defective memory cells present therearound, and it may be insufficient to perform changing in only the defective memory cell.

For example, in the case of flash memories, even after changing, when an erase operation is performed with respect to a non-defective memory cell, an erase operation is also performed with respect to a defective memory cell at the same time. Therefore, an erase operation with respect to a defective memory cell is repeated along with reprogramming of data, so that the defective memory cell which is in an excessively erased state short-circuits bit lines. In addition, when changing is performed in only a defective memory cell, it is difficult to secure reliability, for example. Therefore, in most flash memories, changing for redundant relief is performed in units of a memory sector (erase unit).

In conventional semiconductor memory devices, according to the above-described method, when a defect occurs in a normally used memory cell (memory sector), the defective memory cell (memory sector) is replaced with a redundant memory cell (redundant memory sector) to perform relief, thereby improving the yield.

The configuration of the memory sector, the row decoder, the column decoder, and the like of FIG. 17 is provided only for illustrative purposes, and various other configurations have been conventionally proposed. Note that all conventional configurations have the following feature in common: a memory cell (memory sector) for redundant relief is provided in addition to a memory cell (memory sector) which is normally used.

However, in the conventional technique, an increase in chip area inevitably occurs, resulting in an increase in chip cost. A significant cost increase cancels a cost reduction due to a yield improvement which is an effect of redundant relief. For example, if a cost increase due to a chip area increase exceeds a cost reduction due to a yield improvement, the redundant relief becomes meaningless. Even if a cost increase due to a chip area increase is smaller than a cost reduction due to a yield improvement, the cost reduction effect due to the yield improvement is diminished, thereby making it difficult to reduce the cost of a product.

The increase of the chip area is also caused by other factors. For example, in semiconductor memory devices, if reprogramming of data is frequently performed, stress during use degrades characteristics of a bit storing data (endurance degradation), and, in the worst case, the data is lost. Therefore, the following technique (BISR: Built-In Self-Repairing) has been proposed: a counter which counts the number of times of reprogramming of data into a memory cell is provided in a semiconductor memory device to detect a predetermined number of times of reprogramming, or alternatively, the endurance degradation of a memory cell is itself detected, so that data stored in a predetermined memory cell is automatically reprogrammed into another memory cell. However, if a new memory cell is provided in a semiconductor memory device so as to achieve BISR, this leads to an increase in chip area and an increase in chip cost, as in the case of the above-described redundant relief.

SUMMARY OF THE INVENTION

Therefore, an object of the present invention is to provide a semiconductor memory device which can achieve high performance, such as an improvement in reliability, an improvement in yield, and the like, without increasing the chip area.

The object is achieved by the following semiconductor memory device. The semiconductor memory device is a non-volatile semiconductor memory device operable to program and erase data, and hold the data in the absence of a supplied voltage, comprising a memory cell including a first charge localized portion and a second charge localized portion each operable to store static charge corresponding to the data. The second charge localized portion stores static charge corresponding to static charge which should be stored in the first charge localized portion, thereby serving as a backup to the first charge localized portion.

With the above-described configuration, the second charge localized portion is effectively used, thereby making it possible to achieve high performance, such as an improvement in reliability, an improvement in yield, and the like, without increasing the chip area.

Preferably, the semiconductor memory device comprises a changing section for changing the charge localized portions which should store the static charge corresponding to the data, wherein, when the first charge localized portion has difficulty in storing the static charge due to a production defect, the changing section changes the first charge localized portion to the second charge localized portion. With this configuration, the second charge localized portion is effectively used, thereby making it possible to save a chip which would be otherwise a defective product by redundant relief. In this case, a memory cell which is used in redundant relief is originally present, but is not additionally provided for redundant relief, and therefore, an increase in chip area does not occur.

Preferably, the semiconductor memory device further comprises a plurality of the memory cells, and a flag circuit for outputting a flag signal for changing the charge localized portions in all the plurality of the memory cells. With this configuration, redundant relief can be performed with respect to all the memory cells.

As an example, the flag circuit includes an electrically-reprogrammable non-volatile memory and a latch circuit. With this configuration, an inspection process when redundant relief is performed can be simplified, thereby making it possible to reduce the cost.

As another example, the semiconductor memory device comprises a plurality of bit lines connected to the memory cells, and a plurality of power supply lines for supplying a power supply voltage to the memory cells. The changing section further includes a switch element operable to switch connection combinations between the bit lines and the power supply lines, based on an output from the flag circuit. With this configuration, the changing section can be simply configured.

As still another example, the semiconductor memory device comprises a plurality of power supply lines for supplying a power supply voltage to the memory cells, and a plurality of power supply circuits which are to be connected to the memory cells. The changing section further includes a switch element operable to switch connection combinations between the power supply lines and the power supply circuits, based on an output from the flag circuit. With this configuration, the changing section can be simply configured.

Preferably, the semiconductor memory device further comprises a plurality of memory sectors including a plurality of the memory cells, and a plurality of flag circuits for outputting a flag signal for changing the charge localized portions in each memory sector. With this configuration, redundant relief can be performed for each memory sector, i.e., redundant relief can be performed in smaller units.

As an example, the semiconductor memory device comprises a plurality of power supply lines for supplying a power supply voltage to the memory cells, and a plurality of power supply circuits which are to be connected to the memory cells. The changing section further includes a switch element operable to switch connection combinations between the power supply lines and the power supply circuits, based on an output from the flag circuit. With this configuration, the changing section can be simply configured.

Preferably, the semiconductor memory device comprises a plurality of the memory cells, each of the memory cells being specified with a row address determined with a bit line and a column address determined with a word line, and a plurality of flag circuits for outputting a flag signal for changing the charge localized portions for each row address. With this configuration, redundant relief can be performed for each row address, i.e., redundant relief can be performed in smaller units.

As a example, the semiconductor memory device comprises a plurality of power supply lines for supplying a power supply voltage to the memory cells, and a plurality of power supply circuits which are to be connected to the memory cells. The changing section further includes a switch element operable to switch connection combinations between the power supply lines and the power supply circuits, based on an output from the flag circuit. With this configuration, the changing section can be simply configured.

Preferably, the semiconductor memory device further comprises a plurality of the memory cells, each of the memory cells being specified with a row address determined with a bit line and a column address determined with a word line, and a plurality of flag circuits for outputting a flag signal for changing the charge localized portions for each column address. With this configuration, redundant relief can be performed for each column address, i.e., redundant relief can be performed in smaller units.

As an example, the semiconductor memory device comprises a plurality of power supply lines for supplying a power supply voltage to the memory cells, and a plurality of power supply circuits which are to be connected to the memory cells. The changing section further includes a switch element capable of changing connection combinations between the power supply lines and the power supply circuits, based on an output from the flag circuit. With this configuration, the changing section can be simply configured.

Preferably, the semiconductor memory device further comprises a plurality of the memory cells, each of the memory cells being specified with a row address determined with a bit line and a column address determined with a word line, a plurality of first flag circuits for outputting a flag signal for changing the charge localized portions for each column address, a plurality of second flag circuits for outputting a flag signal for changing the charge localized portions for each row address, and a circuit for calculating a logical multiplication of an output of the first flag circuit and an output of the second flag circuit. With this configuration, redundant relief can be performed for each memory cell, i.e., redundant relief can be performed in smaller units.

As an example, the semiconductor memory device comprises a plurality of power supply lines for supplying a power supply voltage to the memory cells, and a plurality of power supply circuits which are connected to the memory cells. The changing section further includes a switch element capable of changing connection combinations between the power supply lines and the power supply circuits, based on an output from the circuit for calculating the logical multiplication. With this configuration, the changing section can be simply configured.

Preferably, the semiconductor memory device comprises a changing section for changing the charge localized portions which should store static charge corresponding to the data, wherein, when characteristics of the first charge localized portion are degraded due to actual use, the changing section changes the first charge localized portion to the second charge localized portion. With this configuration, the reliability can be improved and the defective product can be saved.

Preferably, the semiconductor memory device comprises a counter circuit for counting the number of times of reprogramming, and when the number of times of reprogramming counted exceeds a predetermined value, outputting a signal, and a flag circuit for outputting a flag signal for changing the charge localized portions, based on the signal output from the counter circuit. With this configuration, the defective product can be saved and the number of times of reprogramming guaranteed can be doubled.

As an example, the counter circuit includes a plurality of memory sectors, including a predetermined number of memory cells, for counting different digits, and when a carry occurs in a lower-digit memory sector, the counter circuit adds and programs one bit to an upper-digit memory sector, and erase the lower-digit memory sector so as to count the number of times of reprogramming. With this configuration, a counter circuit can be configured of less memory cells, thereby avoiding the increase of the chip area.

As another example, the counter circuit includes a plurality of memory cells, and counts the number of times of reprogramming by changing a threshold voltage Vt of the memory cell. With this configuration, a counter circuit can be configured of less memory cells, thereby avoiding the increase of the chip area.

Preferably, the semiconductor memory device further comprises a control circuit for outputting a signal when a predetermined phenomenon is detected during a program or erase operation, and a flag circuit for outputting a flag signal for changing the charge localized portions, based on the signal output from the control circuit. With this configuration, the defective product can be saved and a variation between memory cells can be substantially avoided.

Preferably, when the first charge localized portion stores static charge, the second charge localized portion of the same memory cell stores static charge, and thereafter, the first charge localized portion is subjected to an erase operation before reading out data from the second charge localized portion. With this configuration, the semiconductor memory device does not need to spend a waiting time for erasing data before reprogramming data, and can process a rush of reprogram commands.

The object is also achieved by the following semiconductor memory device. The semiconductor memory device is a non-volatile semiconductor memory device operable to program and erase data, and holding the data in the absence of a supplied voltage, comprising a memory cell including a first charge localized portion and a second charge localized portion each operable to store static charge corresponding to the data. The first charge localized portion is normally used to store static charge to store programmable and erasable data, and when the first charge localized portion cannot normally store static charge, the second charge localized portion is used to store static charge storing data for specifying and repairing the first charge localized portion. With this configuration, the second charge localized portion stores data (so-called ECC) for detecting whether or not the first charge localized portion can normally stores static charge and repairing the first charge localized portion. Therefore, a memory cell for storing an ECC does not need to be separately prepared.

According to the present invention, a semiconductor memory device can be provided which can achieve high performance, such as an improvement in reliability, an improvement in yield, and the like, without increasing the chip area.

These and other objects, features, aspects and advantages of the present invention will become more apparent from the following detailed description of the present invention when taken in conjunction with the accompanying drawings.

BRIEF DESCRIPTION OF THE DRAWINGS

FIG. 17 is a schematic diagram illustrating a configuration of a conventional semiconductor memory device, such as a flash memory or the like.

DESCRIPTION OF THE PREFERRED EMBODIMENTS

Embodiment 1

Figure 1B:
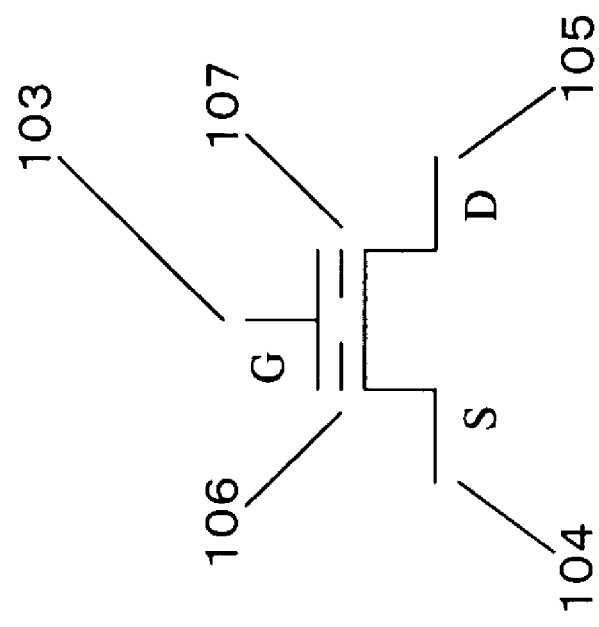
FIG. 1B is a schematic diagram illustrating the MNOS memory cell of Embodiment 1 of the present invention.
Figure 1A:
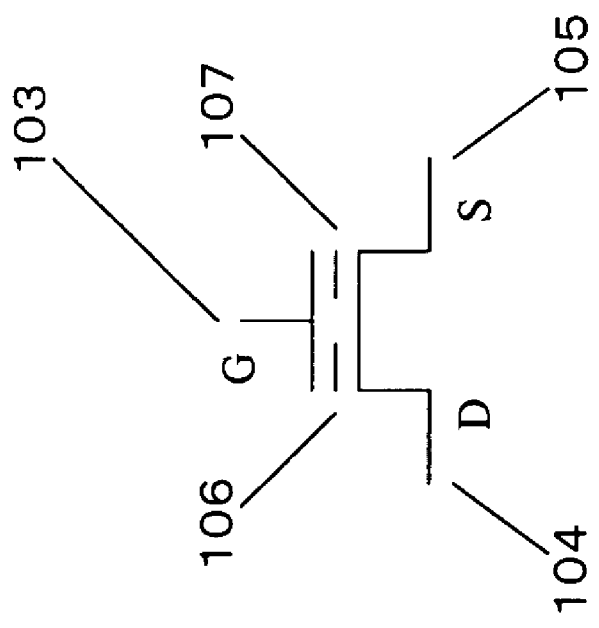
FIG. 1A is a schematic diagram illustrating a MNOS memory cell according to Embodiment 1 of the present invention.
Figure 15B:
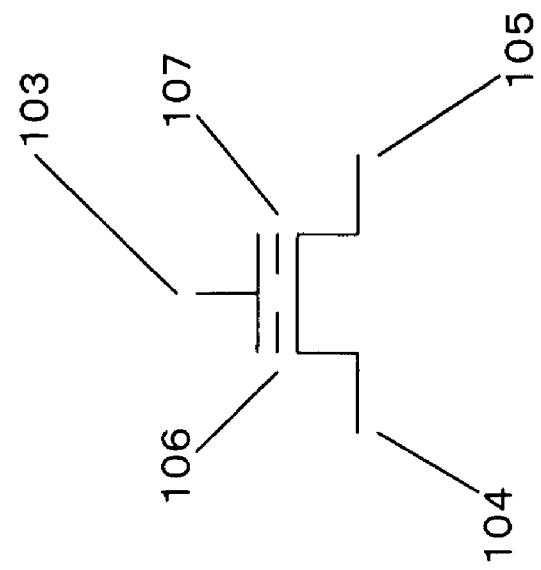
FIG. 15B is a schematic diagram illustrating the MNOS memory cell of FIG. 15A.
Figure 15A:
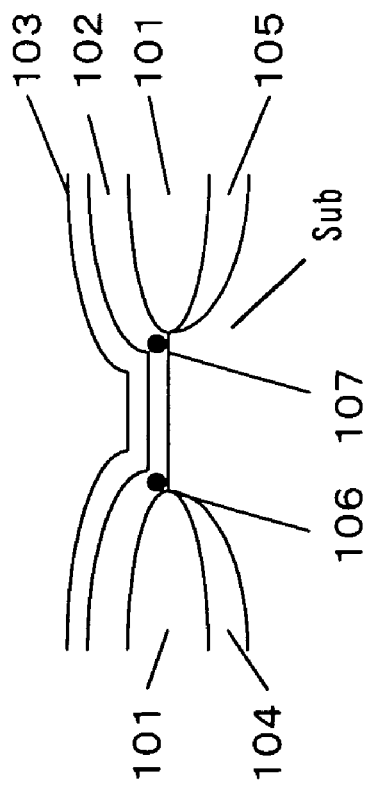
FIG. 15A is a cross-sectional diagram illustrating a general MNOS memory cell.
Figure 16:
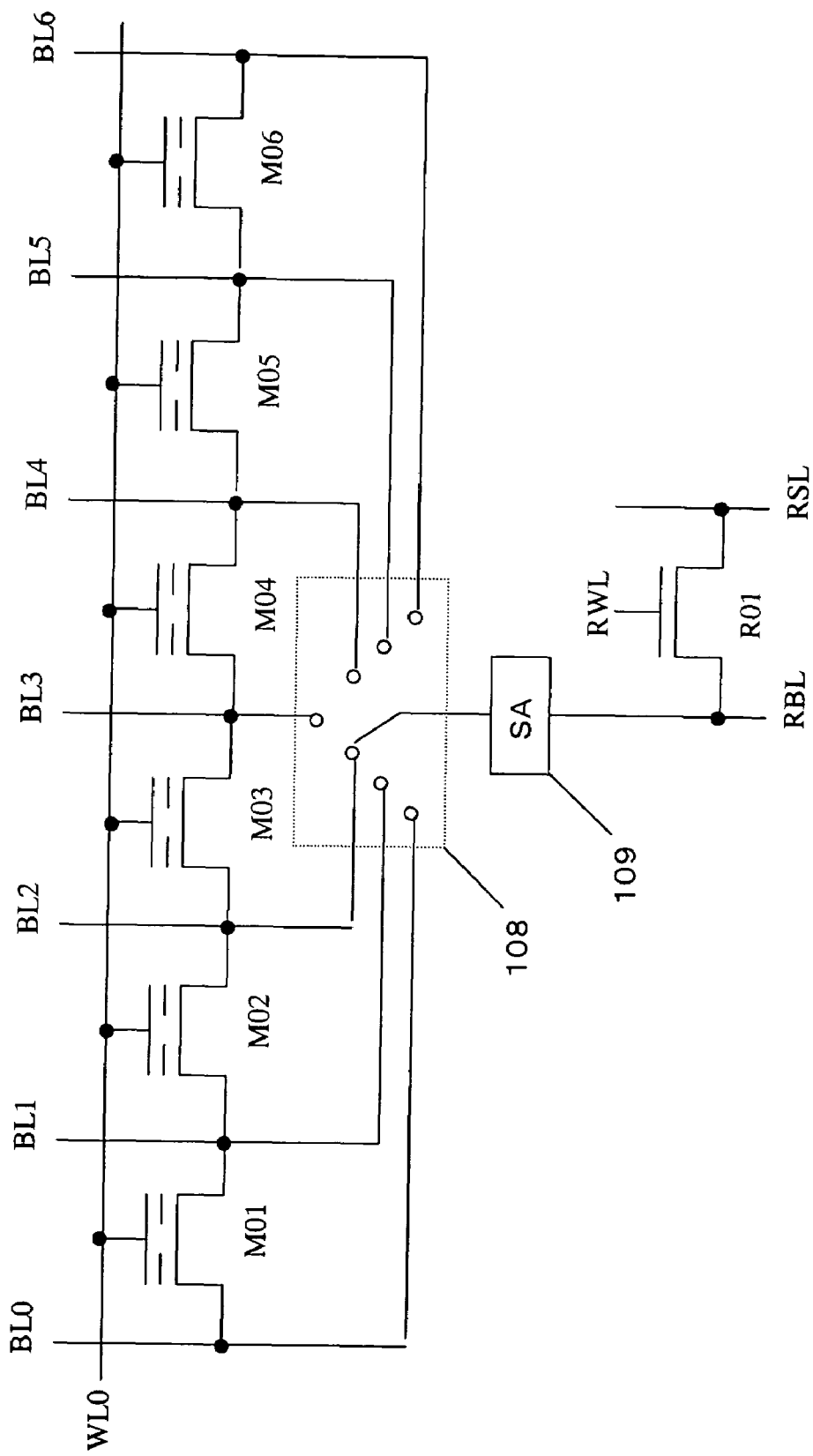
FIG. 16 is a schematic diagram illustrating a memory array composed of conventional memory cells and its vicinity.
Figure 17:
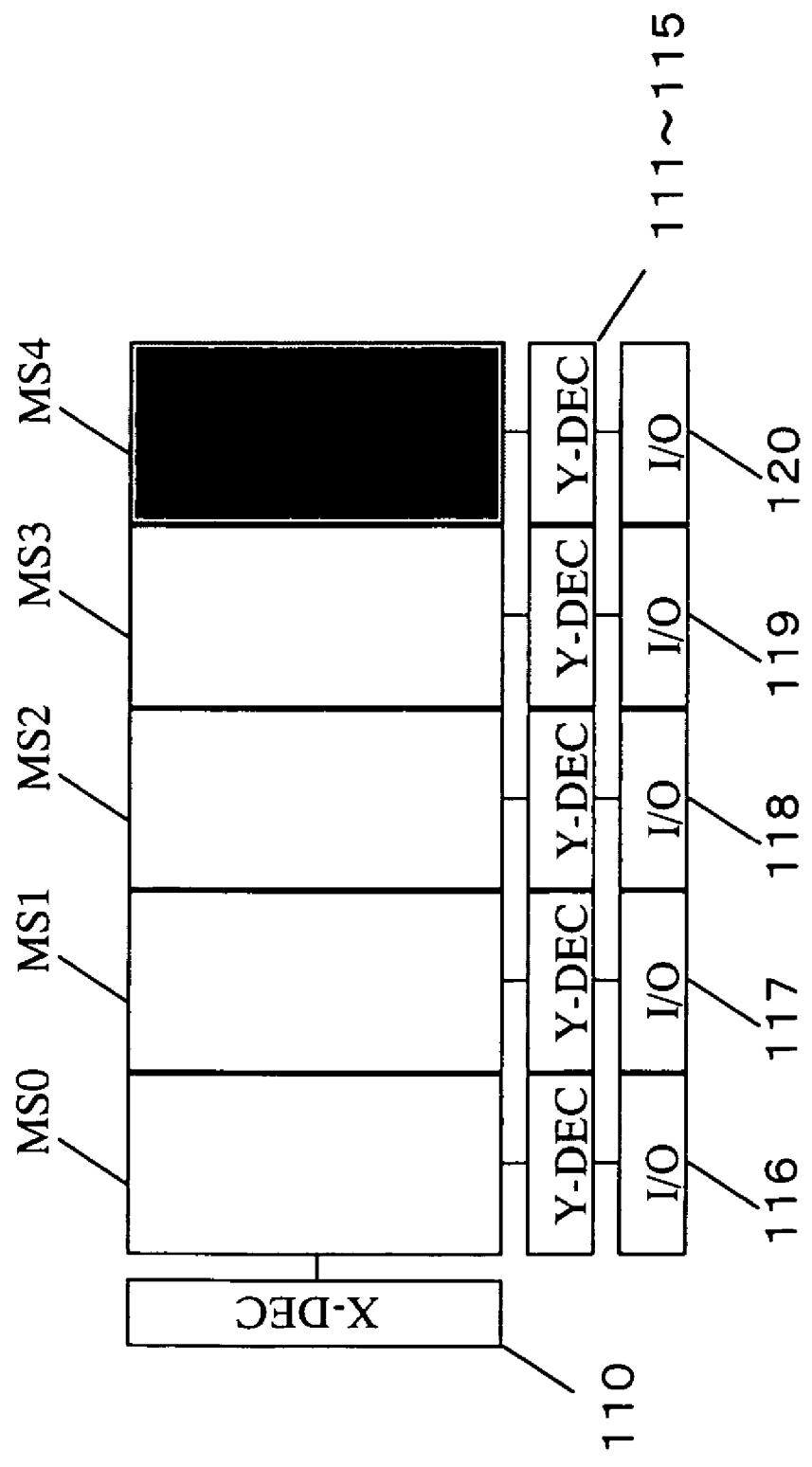

FIGS. 1A and 1B are schematic diagrams illustrating an MNOS memory cell according to Embodiment 1 of the present invention. FIG. 1A illustrates a relationship between a source and a drain when data stored in a charge localized portion 107 is read out, and FIG. 1B illustrates a relationship between a source and a drain when data stored in a charge localized portion 106 is read out. Note that the MNOS memory cell of FIGS. 1A and 1B has the same structure as that of the conventional MNOS memory cell of FIGS. 15A and 15B.

The MNOS memory cell of Embodiment 1 can store two-bit data per cell. The MNOS memory cell of Embodiment 1 is a two-bits/cell memory cell, in which one of the charge localized portions is normally used to store static charge and the other charge localized portion is used as a backup to the static charge stored in the one charge localized portion. Hereinafter, an example will be described, where the charge localized portion 107 is normally used to store static charge corresponding to data, and the charge localized portion 106 is used as a backup to the static charge stored in the charge localized portion 107.

In the MNOS memory cell of Embodiment 1, a data read operation is performed by reading out the static charge stored in the charge localized portion 107. In this case, as illustrated in FIG. 1A, a bias voltage is applied so that a buried diffusion layer 105 closer to the charge localized portion 107 serves as a source, while a buried diffusion layer 104 on the opposite side serves as a drain. By applying the bias voltage in this manner, it can be determined whether or not a current flows into the memory cell, depending on the presence or absence of the static charge stored in the charge localized portion 107, thereby making it possible to read out data stored in the charge localized portion 107.

In the MNOS memory cell of Embodiment 1, a data program operation is performed by storing static charge into the charge localized portion 107. In this case, as illustrated in FIG. 1B, a bias voltage is applied so that the buried diffusion layer 105 closer to the charge localized portion 107 serves as a drain, while the buried diffusion layer 104 on the opposite side serves as a source. By applying the bias voltage in this manner, hot electrons which are generated around the charge localized portion 107 (i.e., in the vicinity of the drain) are injected into the charge localized portion 107, so that data is programmed into the charge localized portion 107.

Here, it is assumed that a defect occurs in the charge localized portion 107 due to a problem during production. Such a defect occurs in the following situations: an oxide film around the charge localized portion 107 becomes thicker than a prescribed thickness, so that a program time or an erase time does not conform to its specification; a number of crystal defects are present in the oxide film around the charge localized portion 107, so that non-volatile data holding characteristics are poor; and the like. When a phenomenon which causes a defect occurs locally, the defect may occur only in the charge localized portion 107, and substantially no problem may occur in the charge localized portion 106 in the same memory cell. Particularly, if the cause of the defect in the charge localized portion 107 is accidental, there may often be substantially no problem with the operation of the charge localized portion 106.

Therefore, when such a defect occurs, a semiconductor memory device according to Embodiment 1 reverses the bias condition applied to the memory cell to change the charge localized portions used to store data. Specifically, a bias condition for a read operation is changed so that, as illustrated in FIG. 1B, the buried diffusion layer 104 closer to the charge localized portion 106 serves as a source, while the buried diffusion layer 105 on the opposite side serves as a drain. Also, a bias condition for a program operation is changed so that, as illustrated in FIG. 1A, the buried diffusion layer 104 closer to the charge localized portion 106 serves as a drain, while the buried diffusion layer 105 on the opposite side serves as a source. The charge localized portion 107, which is no longer used to store data, is caused to be in the erased state.

Figure 2:
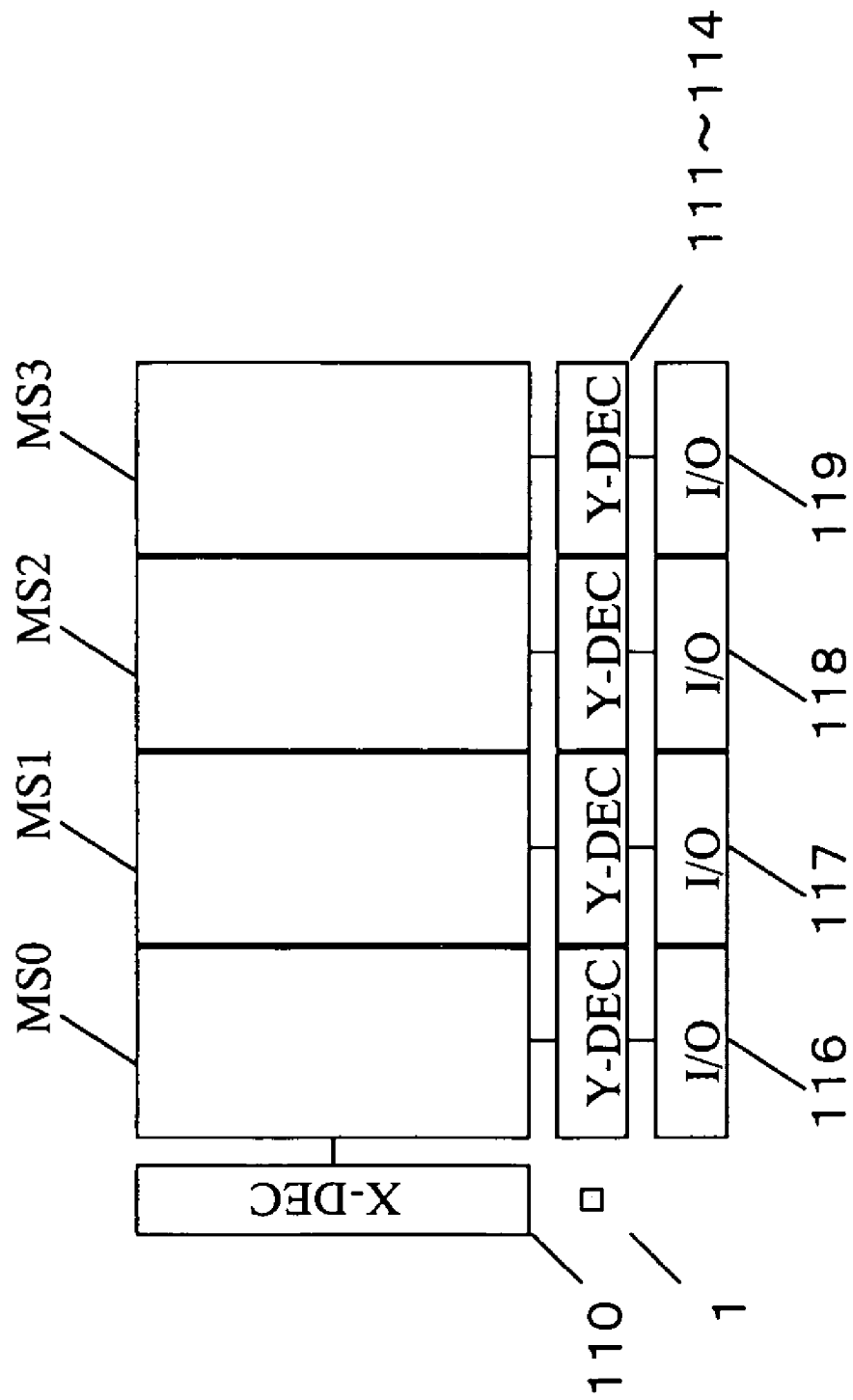
FIG. 2 is a schematic diagram illustrating a whole semiconductor memory device of Embodiment 1 of the present invention.

FIG. 2 is a schematic diagram illustrating the whole semiconductor memory device of Embodiment 1 of the present invention. The semiconductor memory device of Embodiment 1 comprises memory sectors MS0 to MS3 which are normally used to store data. The semiconductor memory device of Embodiment 1 further includes a row decoder 110 (X-DEC) for driving a word line common to the memory sectors, column decoders 111 to 114 (Y-DEC) which are independently provided in the respective memory sectors, I/O circuits 116 to 119 which are independently provided in the respective memory sectors, and a flag circuit 1.

The memory sector is a unit including a group of memory cells. In the case of a flash memory, each memory sector is typically used as a group of memory cells which are simultaneously subjected to an erase operation. Alternatively, the memory sector may be a group of memory cells which have a source line, a bit line, or a word line in common. The row decoder 110 is a group of a decoder which selects one word line in accordance with a designated address and a driver which supplies a potential to the selected word line. Similarly, the column decoders 111 to 114 each select one bit line in accordance with a designated address.

The memory sectors MS0 to MS3 each include a plurality of memory cells. Each memory cell is the MNOS memory cell which is described in FIG. 1, and can store static charge corresponding to two-bit information per cell. As described above, each memory cell has two charge localized portions, i.e., a charge localized portion normally used to store static charge corresponding to data and a charge localized portion used as a backup to the stored static charge. The flag circuit 1 can hold a predetermined flag bit.

When a defect occurs in one of the charge localized portions which is normally used to store static charge of a memory cell included in the memory sectors MS0 to MS3, the semiconductor memory device of Embodiment 1 changes the charge localized portions, which should hold static charge, in all the memory cells based on an output of the flag circuit 1. Specifically, the semiconductor memory device of Embodiment 1 changes the bias voltages of the memory cells in all the memory sectors MS0 to MS3 in accordance with the output of the flag circuit 1, thereby changing the charge localized portions which are used to store data to perform relief with respect to a defective memory cell.

Figure 3:
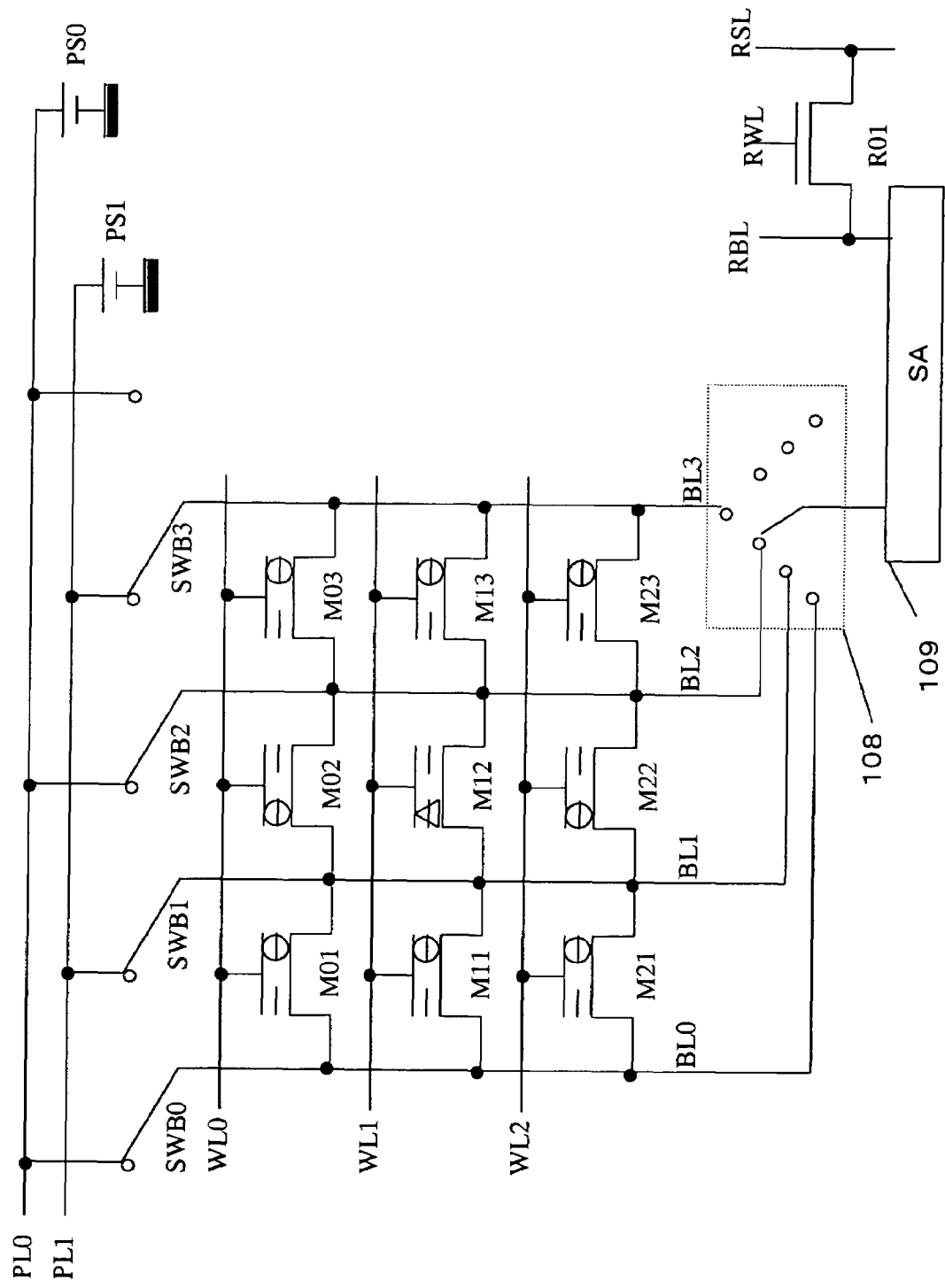
FIG. 3 is a schematic diagram illustrating a memory array included in a memory sector and its vicinity of the semiconductor memory device of Embodiment 1 of the present invention.
Figure 4:
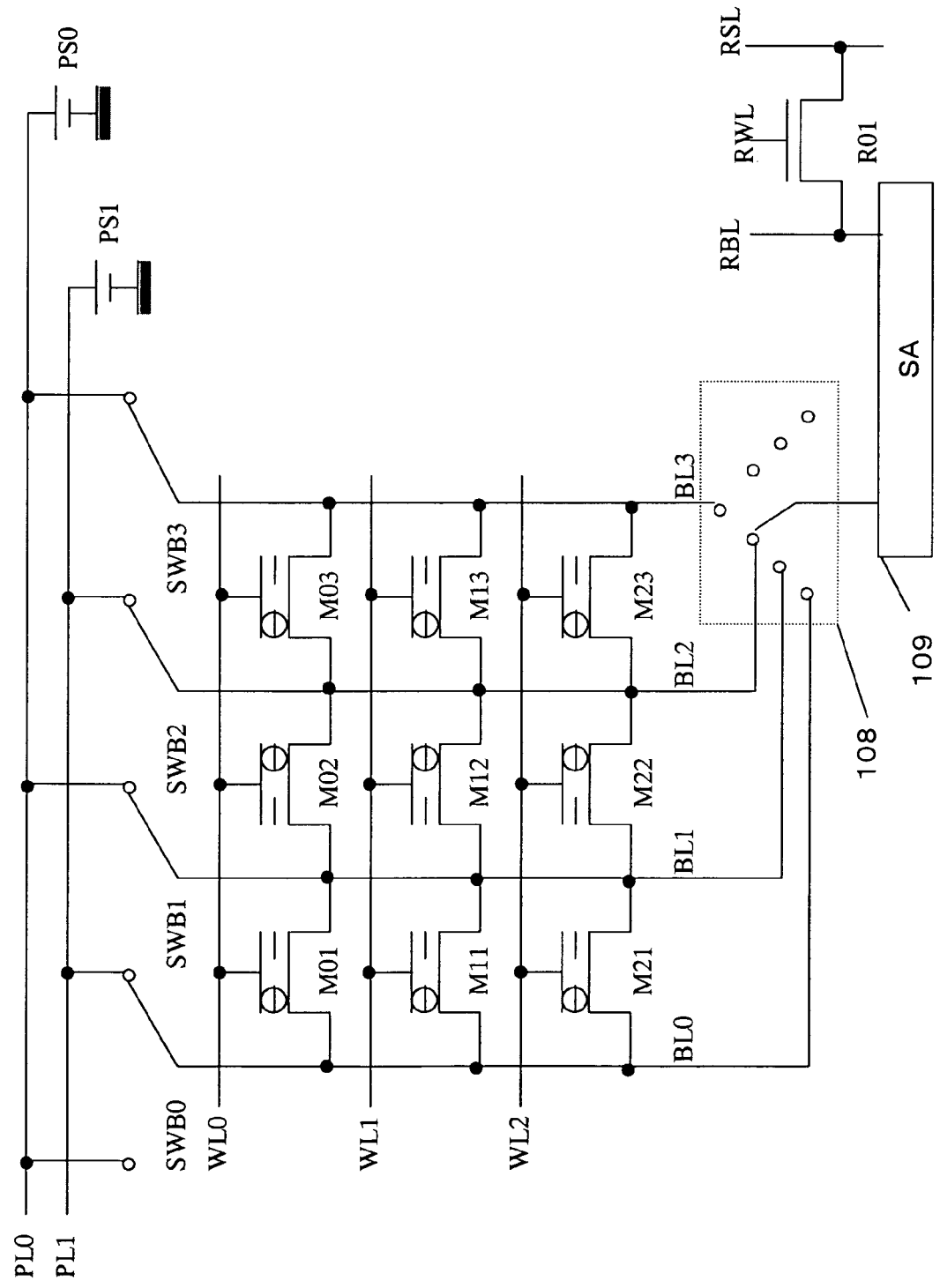
FIG. 4 is a schematic diagram illustrating the memory array included in the memory sector and its vicinity of the semiconductor memory device of Embodiment 1 of the present invention.

FIGS. 3 and 4 are schematic diagrams illustrating a memory array included in the memory sector and its vicinity of the semiconductor memory device of Embodiment 1 of the present invention. For example, regarding memory cells M01, M11, and M21, FIG. 3 is a schematic diagram illustrating the memory array when static charge is stored in a charge localized portion which is located on a right-hand side in the figure, and FIG. 4 is a schematic diagram illustrating the memory array when static charge is stored in a charge localized portion which is located on a left-hand side in the figure. Note that, in FIGS. 3 and 4, due to limitations of space, only a portion of the memory array is illustrated. FIGS. 3 and 4 illustrate the memory array in which nine memory cells are arranged and connected together in a matrix. The memory cells M01 to M03 are arrange in an array extending horizontally in the figure. The gate of each memory cell is connected to a horizontally extending word line WL0 (common node) Similarly, the control gates of memory cells M11 to M13 are connected to a word line WL1, and the control gates of memory cells M21 to M23 are connected to a word line WL2.

The source or drain of each memory cell is connected to a corresponding one of vertically extending bit lines BL0 to BL3 (common nodes). For example, the drains or sources of the memory cells M01 to M21 are connected to the bit line BL0 or BL1, respectively. The drains or sources of the memory cells M02 to M22 are connected to the bit line BL1 or BL2, respectively. The drains or sources of the memory cells M03 to M23 are connected to the bit line BL2 or BL3, respectively.

Each of the bit lines BL0 to BL3 is selectively connected via a switch 108 to one of the inputs of a sense amplifier 109. The drain of a reference cell R01 is connected via a reference bit line RBL to the other input of the sense amplifier 109. The reference cell R01 may be a CMOS transistor which is designed so that a current having substantially a middle magnitude between a memory cell current when held data is 1 and a memory cell current when held data is 0 flows. The reference cell R01 is connected to a source line RSL and a word line RWL. The gate of the reference cell R01 is connected to the word line RWL. An electrode of the reference cell R01 which is not connected to the sense amplifier 109 is a source, which is connected to the source line RSL.

The bit lines BL0 to BL3 are connected via switch elements SWB0 to SWB3, respectively, to a power supply line PL0 connected to a power supply circuit PS0, or a power supply line PL1 connected to a power supply circuit PS1. The switch elements SWB0 to SWB3 are switches which can be turned simultaneously.

In the semiconductor memory device of Embodiment 1, when a read operation is performed, a current of each memory cell is compared with a current of the reference cell R01, and based on the resultant magnitude relationship, data stored in the memory cell is determined. A memory cell from which data is read out is selected by switching the connection of the bit lines to the sense amplifier 109.

In the above-described configuration, firstly, the switch elements SWB0 to SWB3 are initially set so that the bit lines BL0 and BL2 are connected to the power supply line PL0, and the bit lines BL1 and BL3 are connected to the power supply line PL1, as illustrated in FIG. 3. In the above-described configuration, when a read operation is performed, the power supply circuit PS1 supplies a ground potential to the power supply line PL1, and the power supply circuit PS0 supplies a Hi level of potential to the power supply line PL0. As a result, the ground potential is applied to the bit lines BL1 and BL3, and the Hi potential is supplied to the bit lines BL0 and BL2.

In the above-described bias condition, from the memory cells M01, M11, M21, M03, M13, and M23, data stored in the charge localized portion 107 on the right-hand side of the figure of each memory cell is read out. On the other hand, from the memory cells M02, M12, and M22, data stored in the charge localized portion 106 on the left-hand side of the figure of each memory cell is read out. Note that, in FIGS. 3 and 4, a charge localized portion from which data is read out is indicated by adding a symbol (a circle or a triangle).

For example, it is assumed that a defect occurs in the charge localized portion 106 on the left-hand side of the memory cell M12. Here, as described above, the defect occurs, for example, when an oxide film around the charge localized portion 106 of the memory cell M12 becomes thicker than a prescribed thickness, so that a program time or an erase time does not conform to its specification, when a number of crystal defects are present in the oxide film around the charge localized portion 106 of the memory cell M12, so that nonvolatile data holding characteristics are poor, or the like. When a defect is detected in the memory cell M12, a flag signal of the flag circuit 1 is reversed and output.

When a defect occurring in the charge localized portion 106 on the left-hand side of the memory cell M12 is detected and the flag signal is output from the flag circuit 1, the switch elements SWB0 to SWB3 are reversed so as to be in a connected state of FIG. 4, so that the bias condition is changed. The change of the bias condition reverses bias voltages supplied to bit lines, so that the ground potential is applied to the bit lines BL0 and BL2, and the Hi potential is supplied to the bit lines BL1 and BL3.

As a result, the charge localized portions from which data is read are changed in all the memory cells. Therefore, from the memory cells M01, M11, M21, M03, M13, and M23, data stored in the charge localized portion 106 on the left-hand side of the figure of each memory cell is read out, and from the memory cells M02, M12, and M22, data stored in the charge localized portion 107 on the right-hand side of the figure of each memory cell is read out. Regarding the memory cell M12, the charge localized portion 106 on the left-hand side of the figure, in which a defect occurs, can be caused not to be subjected to a read operation.

Note that, when the charge localized portions which should store static charge are changed, the switch elements SWB0 to SWB3 need to be reversed, and in addition, the connection of the switch 108 needs to be changed. Also in program and erase operations, the charge localized portions which should store static charge need to be changed, and this can be achieved by the same method as the method of changing the charge localized portions to be read, and will not be described.

As described above, the semiconductor memory device of Embodiment 1 can use the charge localized portion 106 instead of the charge localized portion 107 in which a defect occurs. Therefore, the memory cell can be used as a nondefective product, and therefore, a chip which would otherwise become a defective product can be saved as a nondefective product. In this case, a memory cell which is used in redundant relief is originally present, but is not additionally provided for redundant relief, and therefore, an increase in chip area does not occur. According to the semiconductor memory device of Embodiment 1, the redundant memory sector MS4 is not required as in the conventional example, and the yield can be improved without increasing the chip area.

Figure 5:
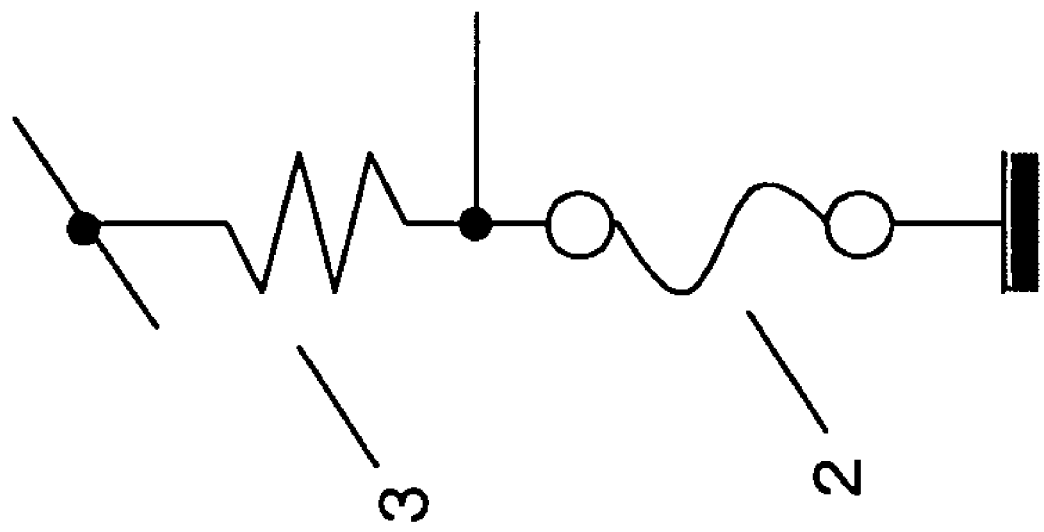
FIG. 5 is a circuit diagram illustrating a first configuration of a flag circuit 1 of the semiconductor memory device of Embodiment 1 of the present invention.

FIG. 5 is a circuit diagram illustrating a first configuration of the flag circuit 1 of the semiconductor memory device of Embodiment 1 of the present invention. It is sufficient that an output of the flag circuit 1 is a binary signal indicating whether or not the charge localized portions, which should store static charge to hold data, are to be changed. Here, as an example, it is assumed that data 0 (Low level) indicates that the charge localized portions are not to be changed, and data 1 (Hi level) indicates that the charge localized portions are to be changed.

For example, when redundant relief is performed during inspection after a production process, the flag circuit 1 having the first configuration can be used. In FIG. 5, the flag circuit 1 includes a physical fuse 2 and a pull-up resistor 3. Specifically, as illustrated in FIG. 5, a common node of the physical fuse 2 connected to the ground and the pull-up resistor 3 connected to a power supply line is used as an output of the flag circuit 1, and only when changing is performed, the fuse is cut. With this configuration, the output of the flag circuit 1 has the Hi level only when changing is performed.

As a second configuration, a memory cell and a latch circuit can be combined to configure the flag circuit 1. Particularly, a portion of the memory cells which are normally used to store static charge corresponding to data can be used as a memory cell included in the flag circuit 1, thereby making it possible to provide the flag circuit 1 in the semiconductor memory device without additionally providing a new circuit configuration.

Figure 6:
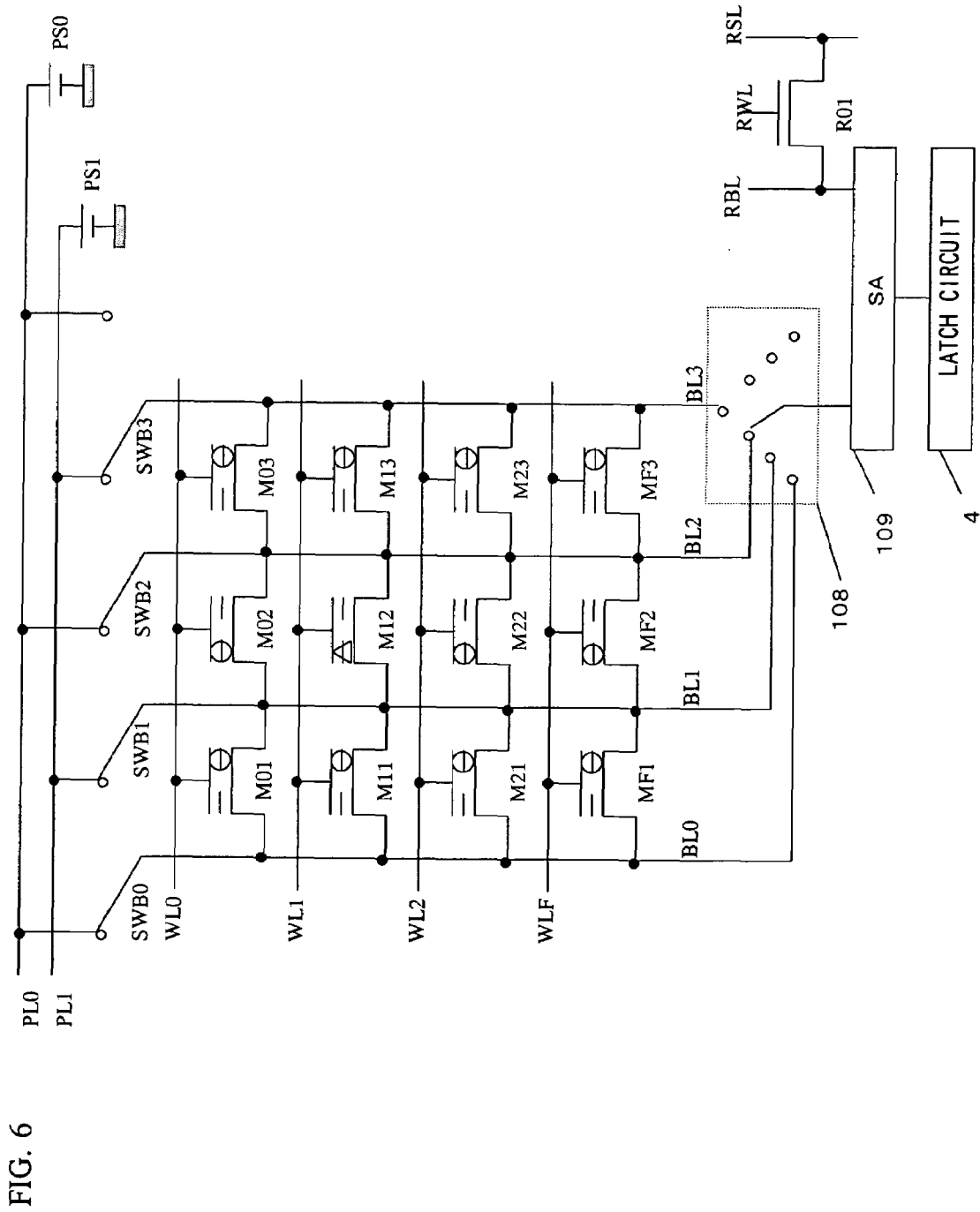
FIG. 6 is a circuit diagram illustrating a second configuration of the flag circuit 1 of the semiconductor memory device of Embodiment 1 of the present invention.

FIG. 6 is a circuit diagram illustrating a memory array including the second configuration of the flag circuit 1 of the semiconductor memory device of Embodiment 1 of the present invention. The memory array of FIG. 6 is the same as the semiconductor memory device of Embodiment 1 of FIGS. 3 and 4, except that memory cells MF1 to MF3 for the flag circuit 1 and a word line WLF connected to the gates of these memory cells are provided in a row direction, and a latch circuit 4 is connected to the sense amplifier 109.

In FIG. 6, when the semiconductor memory device is powered ON, a flag signal is read out from the memory cells MF1 to MF3, and the result is stored into the latch circuit 4. An output of the latch circuit 4 is used as an output indicating changing the charge localized portions. Note that a charge localized portion for data storage of each of the memory cells MF1 to MF3 corresponding to the flag circuit 1 is subjected to a read operation before reading the flag information, and therefore, cannot be changed. One memory cell is sufficient to provide the flag circuit 1, but a plurality of memory cells need to be added under constraints on the configuration of the memory array. Note that memory cells other than a memory cell for holding a flag signal may be used to store flag signals for other applications, for example.

Thus, by using the flag circuit 1 having the second configuration, a flag signal for providing an output indicating changing of the charge localized portions is stored in a memory cell itself, thereby making it possible to perform redundant relief without complicating the inspection step and increasing the cost, unlike the first configuration.

Embodiment 2

Figure 7:
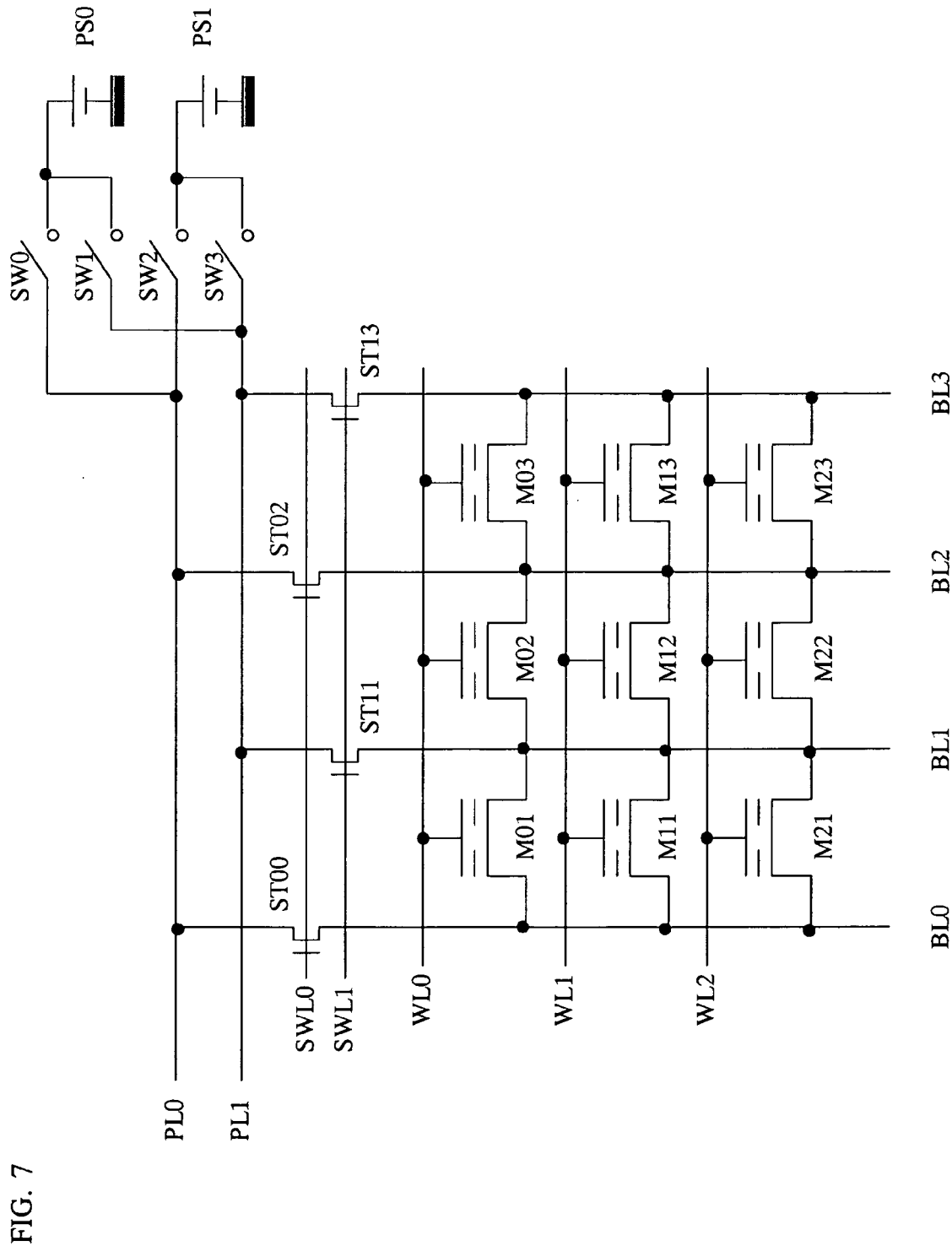
FIG. 7 is a schematic diagram illustrating a memory array included in a memory sector of a semiconductor memory device according to Embodiment 2 of the present invention and its vicinity.

FIG. 7 is a schematic diagram illustrating a memory array included in a memory sector of a semiconductor memory device according to Embodiment 2 of the present invention and its vicinity. The semiconductor memory device of Embodiment 2 has substantially the same configuration as that of Embodiment 1 of FIGS. 2 to 4. Therefore, a difference therebetween will be hereinafter described, and the same parts will not be described. Also in FIG. 7, the same reference characters as those of Embodiment 1 indicate the same parts.

The semiconductor memory device of Embodiment 2 is different from that of Embodiment 1 of FIGS. 2 to 4 in connection portions between the bit lines BL0 to BL3 and the power supply lines PL0 and PL1. The semiconductor memory device of Embodiment 2 does not have the switch elements SWB0 to SWB3. Instead, the semiconductor memory device of Embodiment 2 has select word lines SWL0 and SWL1. The bit line BL0 is connected via a select transistor ST00 to the select word line SWL0. The bit line BL1 is connected via a select transistor ST11 to the select word line SWL1. The bit line BL2 is connected via a select transistor ST02 to the select word line SWL0. The bit line BL3 is connected via a select transistor ST13 to the select word line SWL1.

Also in the semiconductor memory device of Embodiment 2, the power supply line PL0 is connected via a switch element SW0 to the power supply circuit PS0, and via a switch element SW2 to the power supply circuit PS1. The power supply line PL1 is connected via a switch element SW1 to the power supply circuit PS0, and via a switch element SW3 to the power supply circuit PS1. Note that the switch 108, the sense amplifier 109, the flag circuit 1, and the like are the same as those of Embodiment 1 and are not illustrated in FIG. 7.

In the semiconductor memory device of Embodiment 2, a potential supplied to the power supply line PL0 and the power supply line PL1 can be controlled, depending on states of the switch elements SW0 to SW3. As in Embodiment 1, it is assumed that the power supply circuit PS1 supplies a ground potential, and the power supply circuit PS0 supplies a Hi level of potential.

For example, when the switch elements SW0 and SW3 are in the ON state and the switch elements SW1 and SW2 are in the OFF state, the Hi-level potential is supplied to the power supply line PL0, so that the bit lines BL0 and BL2 connected via the select transistors ST00 and ST02 to the power supply line PL0 go to the Hi-level potential. Also, the ground-level potential is supplied to the power supply line PL1, so that the bit lines BL1 and BL3 connected via the select transistors ST11 and ST13 to the power supply line PL1 go to the ground-level potential.

Conversely, when the switch elements SW0 and SW3 are in the OFF state and the switch elements SW1 and SW2 are in the ON state, the potentials supplied to the power supply lines PL0 and PL1 are reversed, and therefore, the potentials supplied to the bit lines BL0 to BL3 are reversed. By changing bias voltage conditions in the above-described manner, the charge localized portions which store static charge corresponding to data can be changed as in Embodiment 1.

In the above-described configuration, when a read operation is performed, the switch elements SW0 and SW3 are initially set to be in the ON state, and the switch elements SW1 and SW2 are initially set to be in the OFF state. The power supply circuit PS1 supplies the ground potential to the power supply line PL1, and the power supply circuit PS0 supplies the Hi-level potential to the power supply line PL0. As a result, the ground potential is supplied to the bit lines BL1 and BL3, and the Hi potential is supplied to the bit lines BL0 and BL2.

In the above-described bias condition, from the memory cells M01, M11, M21, M03, M13, and M23, data stored in the charge localized portion 107 on the right-hand side of the figure of each memory cell is read out. On the other hand, from the memory cells M02, M12, and M22, data stored in the charge localized portion 106 on the left-hand side of the figure of each memory cell is read out.

As in Embodiment 1, when a defect occurring in the charge localized portion 106 on the left-hand side of the memory cell M12 is detected, so that the flag signal is output from the flag circuit 1, the settings of the switch elements are reversed, i.e., the switch elements SW0 and SW3 are in the OFF state and the switch elements SW1 and SW2 are in the ON state, so that the bias condition is changed. By changing the bias condition, the bias voltages supplied to the bit lines are changed, so that the ground potential is supplied to the bit lines BL0 and BL2, and the Hi potential is supplied to the bit lines BL1 and BL3.

As a result, the charge localized portions from which data is read out are changed in all the memory cells, so that, from the memory cells M01, M11, M21, M03, M13, and M23, data stored in the charge localized portion 106 on the left-hand side of the figure of each memory cell is read out, and from the memory cells M02, M12, and M22, data stored in the charge localized portion 107 on the right-hand side of the figure of each memory cell is read out. Regarding the memory cell M12, the charge localized portion 106 on the left-hand side of the figure, in which a defect occurs, can be caused not to be subjected to a read operation.

As described above, the semiconductor memory device of Embodiment 2 can use the charge localized portion 106 instead of the charge localized portion 107 in which a defect occurs. Therefore, the memory cell can be used as a non-defective product, and therefore, a chip which would otherwise become a defective product can be saved as a non-defective product. In this case, a memory cell which is used in redundant relief is originally present, but is not additionally provided for redundant relief, and therefore, an increase in chip area does not occur.

According to the semiconductor memory device of Embodiment 2, the redundant memory sector MS4 is not required as in the conventional example, the yield can be improved without increasing the chip area. In addition, in the semiconductor memory device of Embodiment 2, by providing a switch which changes bias voltages in the vicinity of a power supply circuit, circuits, such as a switch element added so as to change bias voltages, and the like, can be minimized.

Embodiment 3

Figure 8:
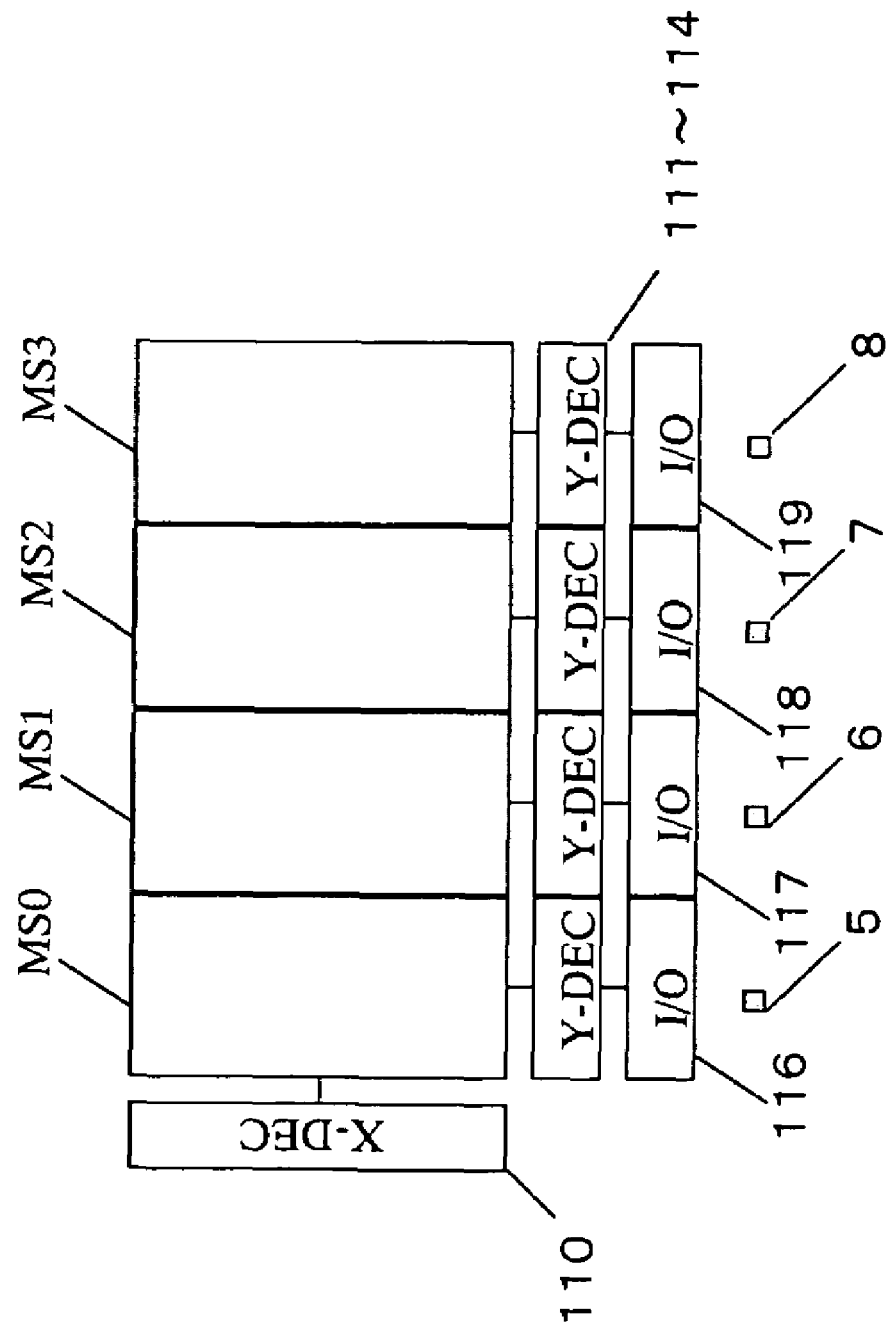
FIG. 8 is a schematic diagram illustrating a whole semiconductor memory device according to Embodiment 3 of the present invention.

FIG. 8 is a schematic diagram illustrating a whole semiconductor memory device according to Embodiment 3 of the present invention. The semiconductor memory device of Embodiment 3 has substantially the same configuration as that of Embodiment 1. Therefore, a difference therebetween will be hereinafter described, and the same parts will not be described. Also in FIG. 8, the same reference characters as those of Embodiments 1 and 2 indicate the same parts.

The semiconductor memory device of Embodiment 3 comprises flag circuits 5 to 8 corresponding to the memory sectors MS0 to MS3. The semiconductor memory device of Embodiment 3 is different from those of Embodiments 1 and 2 in that, when a defect occurs in a charge localized portions normally used to store static charge of any memory cell included in the memory sectors MS0 to MS3, the charge localized portions are changed for each memory sector based on an output of a flag circuit corresponding to the memory sector including the memory cell. For example, when a memory cell in which a defect occurs is included in the memory sector MS1, the semiconductor memory device of Embodiment 3 changes bias voltages of the memory cell included in the memory sector MS1 in accordance with an output of the flag circuit 6, to change the charge localized portions which are used to store data, thereby saving the defective memory cell. Note that, in the semiconductor memory device of Embodiment 3, an operation of changing the bias voltages can be performed using the method of Embodiment 2 described with reference to FIG. 7, or the like.

With the above-described configuration, the semiconductor memory device of Embodiment 3 can reverse the bias voltages for each memory sector based on an output from a flag circuit provided for each memory sector. Therefore, in the semiconductor memory device of Embodiment 3, by adding a flag circuit to each memory sector (i.e., a small change in circuitry), the bias voltages can be changed for each sector, so that redundant relief can be effectively achieved in smaller units.

Embodiment 4

Figure 9:
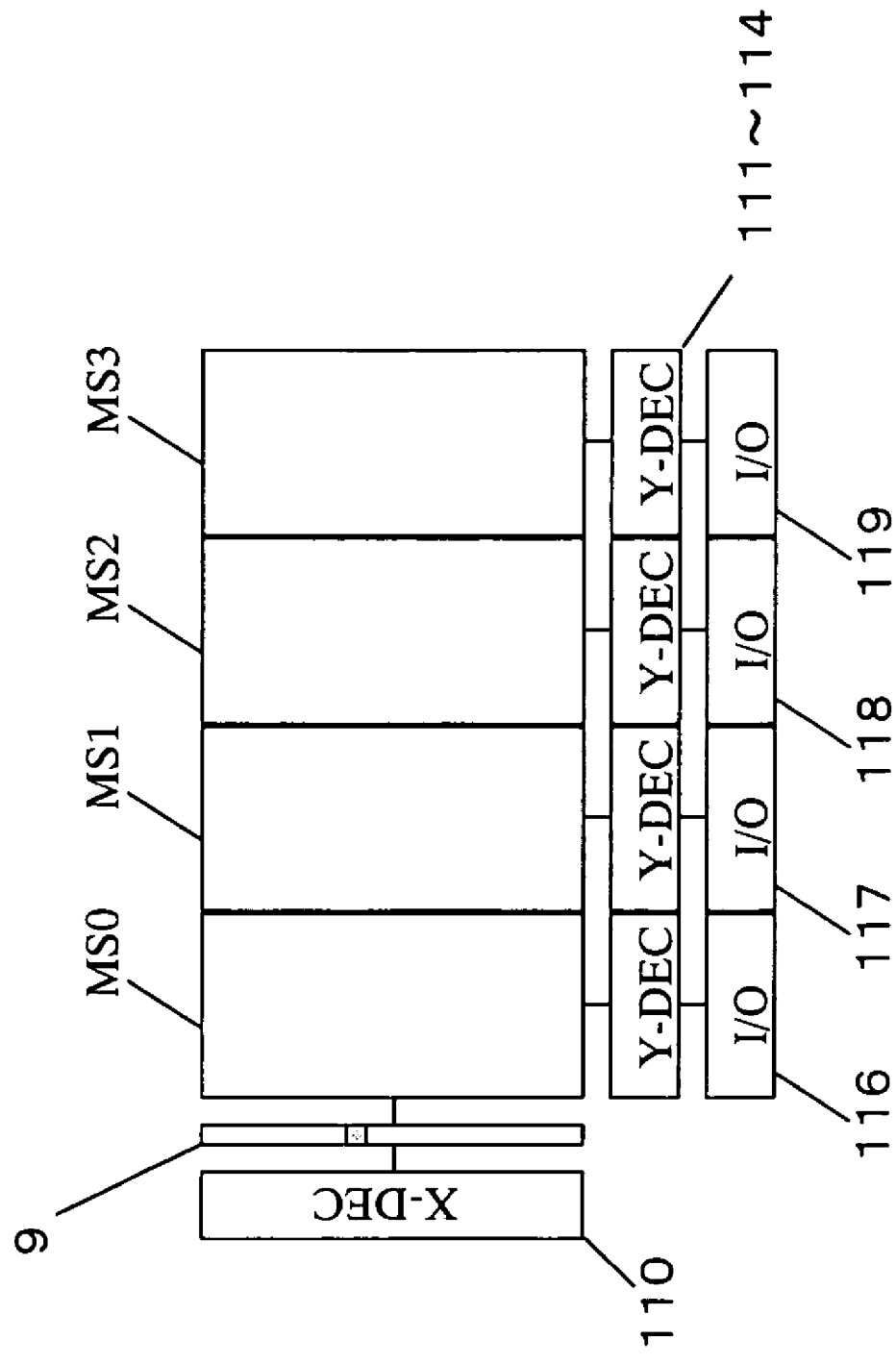
FIG. 9 is a schematic diagram illustrating a whole semiconductor memory device according to Embodiment 4 of the present invention.

FIG. 9 is a schematic diagram illustrating a whole semiconductor memory device according to Embodiment 4 of the present invention. The semiconductor memory device of Embodiment 4 has substantially the same configuration as that of Embodiment 1. Therefore, a difference therebetween will be hereinafter described, and the same parts will not be described. Also in FIG. 9, the same reference characters as those of Embodiments 1 and 2 indicate the same parts.

The semiconductor memory device of Embodiment 4 is characterized by comprising a flag circuit for each row address of memory cells in the memory sectors MS0 to MS3. A flag circuit corresponding to each row address is illustrated in a flag circuit group 9 of FIG. 9. The flag circuit group 9 is connected between the row decoder 110 for driving word lines common to the memory sectors and the memory cells.

The semiconductor memory device of Embodiment 4 is different from those of Embodiments 1 and 2 in that, when a defect occurs in a charge localized portion which is normally used to store static charge of any memory cell, the charge localized portions are changed for each row address based on an output of a flag circuit corresponding to the row address of a word line of the memory cell in which the defect occurs. For example, when the memory cell in which the defect occurs is included in the memory sector MS1 and is connected to the word line WL1, the semiconductor memory device of Embodiment 4 changes the bias voltages of memory cells connected to the word line WL1 based on an output of a flag circuit corresponding to the word line WL1 to change the charge localized portions which are used to store data, thereby saving the defective memory cell. Note that, in the semiconductor memory device of Embodiment 4, an operation of changing the bias voltages can be performed using the method of Embodiment 2 described with reference to FIG. 7, or the like.

As in Embodiments 1 to 3, the semiconductor memory device of Embodiment 4 determines whether or not the bias condition reversal for changing the charge localized portions which store data is to be performed, based on the output of the flag circuit. However, in Embodiments 1 to 3, if the changing has been once determined, the changing is not performed during the operation. In contrast, the semiconductor memory device of Embodiment 4 reverses the bias condition only when the flag circuit group 9 accesses a memory cell at a row address for which the charge localized portions should be changed. In other words, the semiconductor memory device of Embodiment 4 controls the changing of the bias voltages in real time in accordance with the output of the flag circuit group 9.

With the above-described configuration, the semiconductor memory device of Embodiment 4 can reverse the bias voltages for each row address based on the output of a flag circuit provided for each row address. Therefore, in the semiconductor memory device of Embodiment 4, by adding a flag circuit for each row address (i.e., a small change in circuitry), the bias voltages can be changed for each word line, so that redundant relief can be effectively achieved in smaller units. In addition, the semiconductor memory device of Embodiment 4 can change the bias voltages in real time.

Embodiment 5

Figure 10:
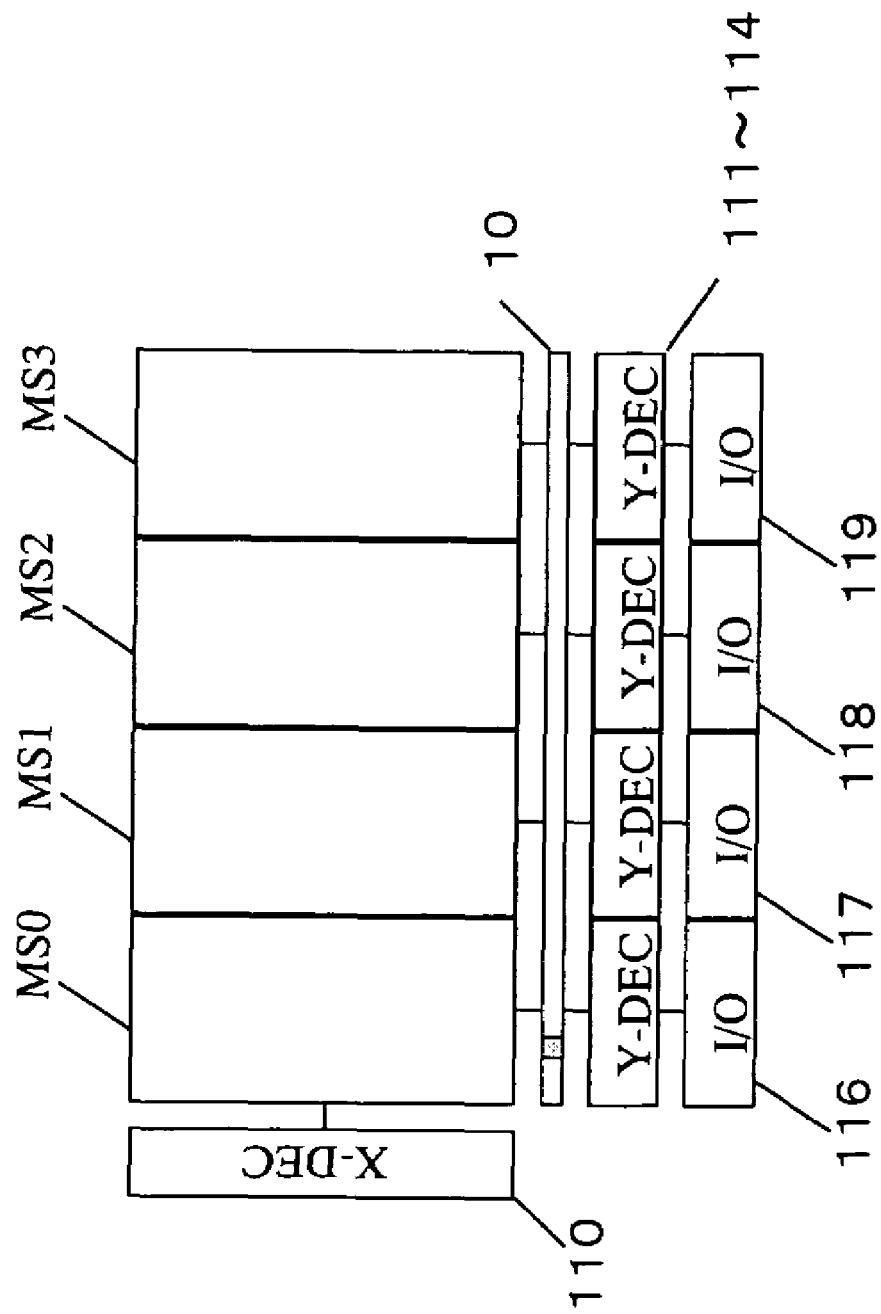
FIG. 10 is a schematic diagram illustrating a whole semiconductor memory device according to Embodiment 5 of the present invention.

FIG. 10 is a schematic diagram illustrating a whole semiconductor memory device according to Embodiment 5 of the present invention. The semiconductor memory device of Embodiment 5 has substantially the same configuration as that of Embodiment 1. Therefore, a difference therebetween will be hereinafter described, and the same parts will not be described. Also in FIG. 10, the same reference characters as those of Embodiments 1 and 2 indicate the same parts.

The semiconductor memory device of Embodiment 5 is characterized by comprising a flag circuit for each column address of memory cells in the memory sectors MS0 to MS3. A flag circuit corresponding to each column address is illustrated in a flag circuit group 10 of FIG. 10. The flag circuit group 10 is connected between the column decoders 111 to 114 for driving a bit line common to the memory sectors and the memory cells.

The semiconductor memory device of Embodiment 5 is different from those of Embodiments 1 and 2 in that, when a defect occurs in a charge localized portions which is normally used to store static charge of any memory cell, the charge localized portions are changed for each column address based on an output of a flag circuit corresponding to the column address of a bit line of the memory cell in which the defect occurs. For example, when the memory cell in which the defect occurs is included in the memory sector MS1 and is connected to the bit line BL1, the semiconductor memory device of Embodiment 5 changes the bias voltages of memory cells connected to the bit line BL1 based on an output of a flag circuit corresponding to the bit line BL1 to change the charge localized portions which are used to store data, thereby saving the defective memory cell. Note that, in the semiconductor memory device of Embodiment 5, an operation of changing the bias voltages can be performed using the method of Embodiment 2 described with reference to FIG. 7, or the like.

As in Embodiments 1 to 3, the semiconductor memory device of Embodiment 5 determines whether or not the bias condition reversal for changing the charge localized portions which store data is to be performed, based on the output of a flag circuit. However, in Embodiments 1 to 3, if the changing has been once determined, the changing is not performed during the operation. In contrast, the semiconductor memory device of Embodiment 5 reverses the bias condition only when the flag circuit group 10 accesses a memory cell at a column address for which the charge localized portions should be changed. In other words, the semiconductor memory device of Embodiment 5 controls the changing of the bias voltages in real time in accordance with the output of the flag circuit group 10.

With the above-described configuration, the semiconductor memory device of Embodiment 5 can reverse the bias voltages for each column address based on the output of a flag circuit provided for each column address. Therefore, in the semiconductor memory device of Embodiment 5, by adding a flag circuit for each column address (i.e., a small change in circuitry), the bias voltages can be changed for each bit line, so that redundant relief can be effectively achieved in smaller units. In addition, the semiconductor memory device of Embodiment 5 can change the bias voltages in real time.

Embodiment 6

Figure 11:
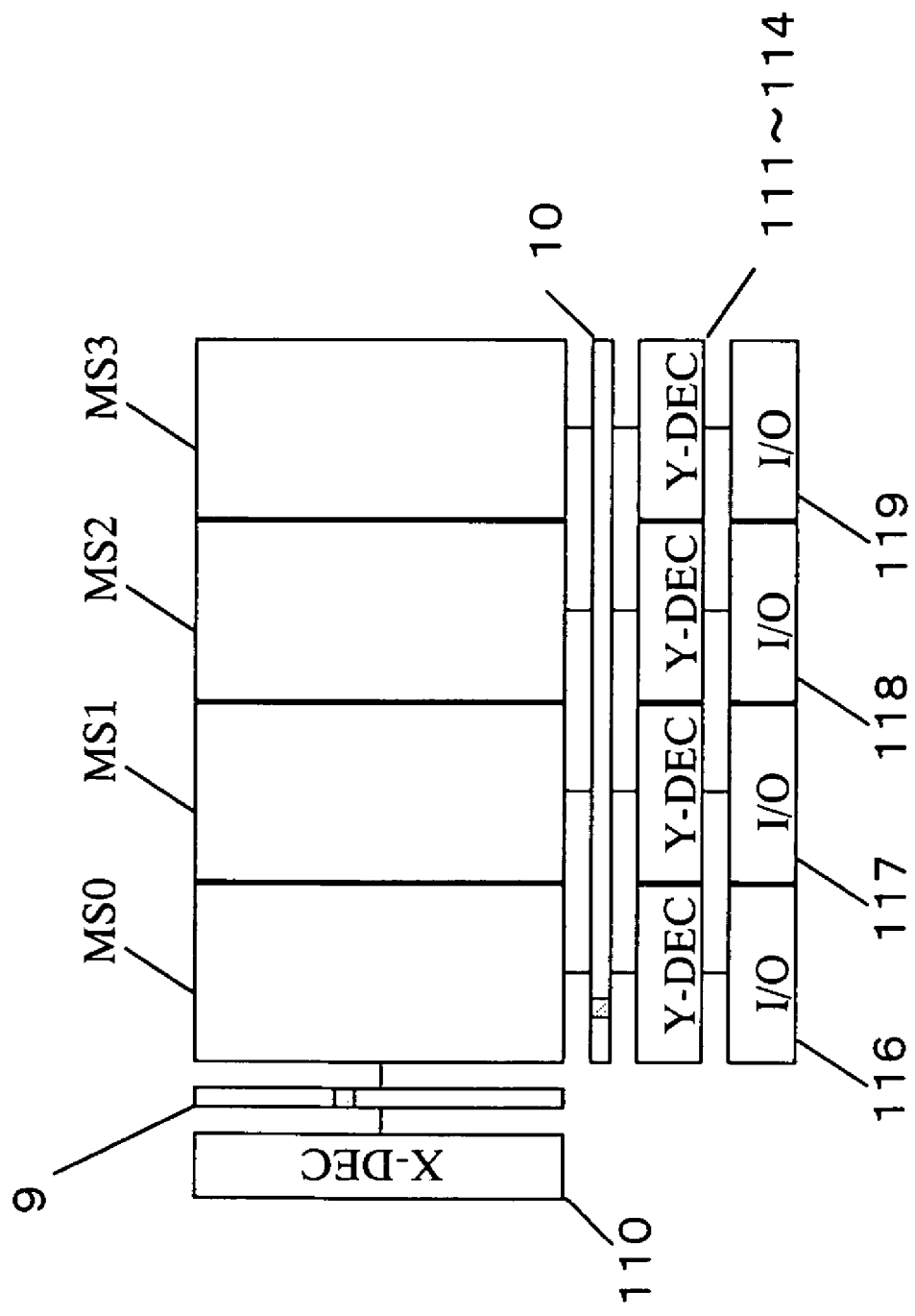
FIG. 11 is a schematic diagram illustrating a whole semiconductor memory device according to Embodiment 6 of the present invention.

FIG. 11 is a schematic diagram illustrating a whole semiconductor memory device according to Embodiment 6 of the present invention. The semiconductor memory device of Embodiment 6 has substantially the same configuration as that of Embodiment 1. Therefore, a difference therebetween will be hereinafter described, and the same parts will not be described. Also in FIG. 11, the same reference characters as those of Embodiments 1 and 2 indicate the same parts.

The semiconductor memory device of Embodiment 6 is characterized by comprising a flag circuit for each row address and each column address of memory cells in the memory sectors MS0 to MS3. A flag circuit corresponding to each row address is illustrated in a flag circuit group 9 of FIG. 11. The flag circuit group 9 is connected between the row decoder 110 for driving word lines common to the memory sectors and the memory cells. A flag circuit corresponding to each column address is illustrated in a flag circuit group 10 of FIG. 11. The flag circuit group 10 is connected between the column decoders 111 to 114 for driving a bit line common to the memory sectors and the memory cells.

The semiconductor memory device of Embodiment 6 is different from those of Embodiments 1 and 2 in that, when a defect occurs in a charge localized portion which is normally used to store static charge of any memory cell, the charge localized portions are changed for the memory cell based on a logical multiplication of an output of a flag circuit corresponding to the row address of a word line of the memory cell in which the defect occurs and an output of a flag circuit corresponding to the column address of a bit line of the memory cell in which the defect occurs. For example, when the memory cell in which the defect occurs is included in the memory sector MS1 and is connected to the word line WL1 and the bit line BL1, the semiconductor memory device of Embodiment 6 calculates a logical multiplication of an output of a flag circuit corresponding to the word line WL1 and an output of a flag circuit corresponding to the bit line BL1, and based on the result, changes the bias voltages of the memory cell to change the charge localized portions which are used to store data, thereby saving the defective memory cell. Note that, in the semiconductor memory device of Embodiment 6, an operation of changing the bias voltages can be performed using the method of Embodiment 2 described with reference to FIG. 7, or the like.

As in Embodiments 1 to 3, the semiconductor memory device of Embodiment 6 determines whether or not the bias condition reversal for changing the charge localized portions which store data is to be performed, based on the output of a flag circuit. However, in Embodiments 1 to 3, if the changing has been once determined, the changing is not performed during the operation. In contrast, the semiconductor memory device of Embodiment 6 reverses the bias condition only when a specific memory cell is accessed. In other words, the semiconductor memory device of Embodiment 6 controls the changing of the bias voltages in real time in accordance with the logical multiplication of the output of the flag circuit group 9 and the output of the flag circuit group 10.

With the above-described configuration, the semiconductor memory device of Embodiment 6 can reverse the bias voltages for each memory cell based on the logical multiplication of the output of a flag circuit provided for each row address and the output of a flag circuit provided for each column address. Therefore, in the semiconductor memory device of Embodiment 6, by adding a flag circuit for each row address and each column address (i.e., a small change in circuitry), the bias voltages can be changed for each memory cell, so that redundant relief can be effectively achieved in smaller units. In addition, the semiconductor memory device of Embodiment 6 can change the bias voltages in real time.

Embodiment 7

Figure 12:
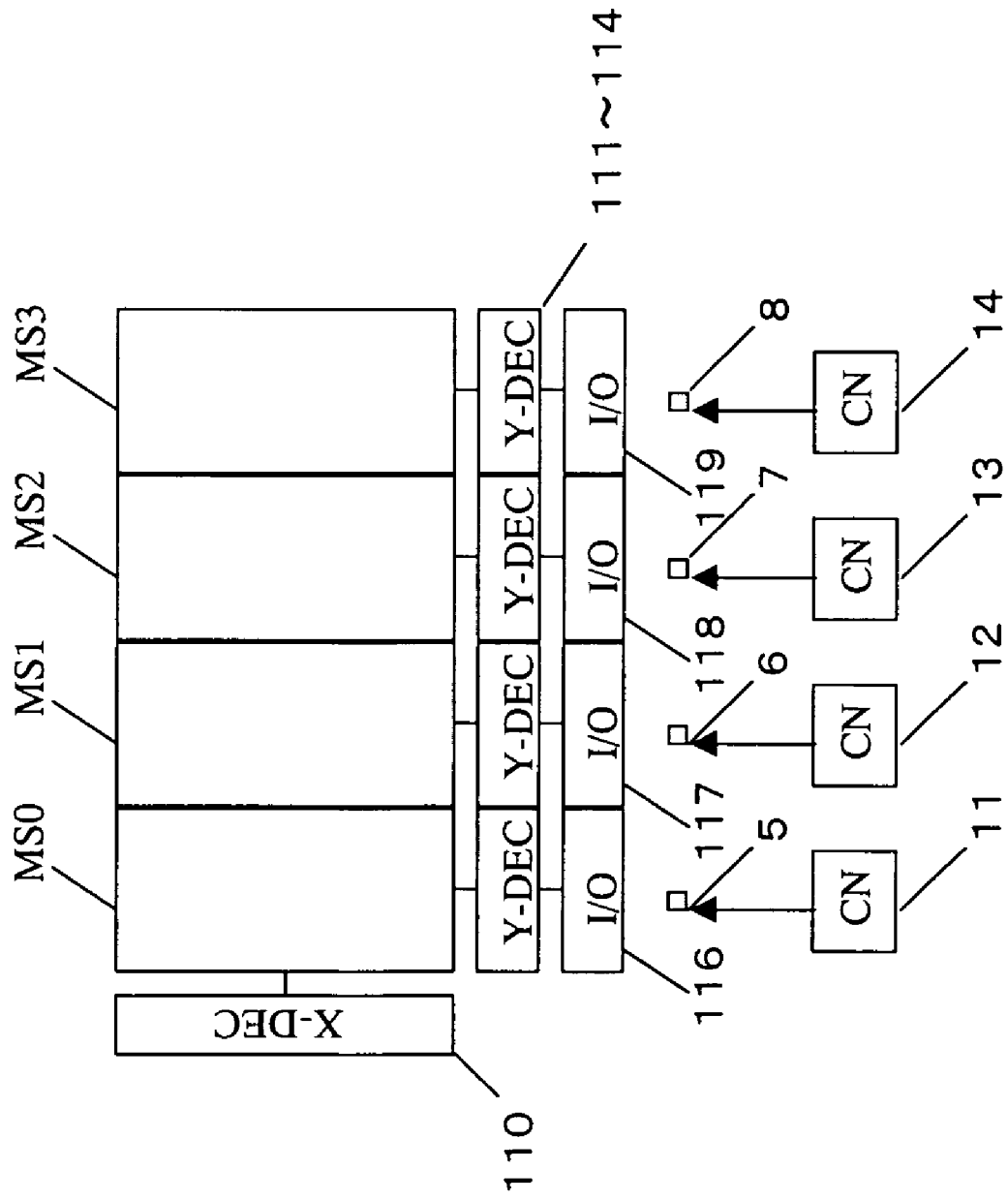
FIG. 12 is a schematic diagram illustrating a whole semiconductor memory device according to Embodiment 7 of the present invention.

FIG. 12 is a schematic diagram illustrating a whole semiconductor memory device according to Embodiment 7 of the present invention. The semiconductor memory device of Embodiment 7 has substantially the same configuration as that of Embodiment 1. Therefore, a difference therebetween will be hereinafter described, and the same parts will not be described. Also in FIG. 12, the same reference characters as those of Embodiments 1 and 2 indicate the same parts.

Generally, in semiconductor memory devices, if reprogramming of data is frequently performed, stress during use degrades characteristics of a bit for storing data (endurance degradation), and, in the worst case, programming or erasing of data is disabled. Therefore, in the semiconductor memory device of Embodiment 7, in order to improve the reliability of the device, the charge localized portions which are normally used to store static charge of a memory cell are changed before programming or erasing of data is disabled due to the endurance degradation, thereby protecting the memory cell.

The semiconductor memory device of Embodiment 7 is characterized by comprising flag circuits 5 to 8 provided for the memory sectors MS0 to MS3, respectively, and counter circuits 11 to 14 provided for the memory sectors MS0 to MS3, respectively, and in that each counter circuit and each flag circuit are connected to each memory sector.

The semiconductor memory device of Embodiment 7 is shipped in a state that any one of the charge localized portions is specified to be normally used to store static charge. The counter circuits 11 to 14 count up every time the respective corresponding memory sectors are reprogrammed. In each counter circuit, when the number of times of reprogramming exceeds a predetermined number of times, a program operation is performed with respect to the flag circuit of a memory sector corresponding to the counter circuit, so that the output of the flag circuit is changed to an output indicating changing of the charge localized portions.

For example, when the number of times of reprogramming counted by the counter circuit 11 exceeds the predetermined number of times, the counter circuit 11 programs a signal into the flag circuit 5, so that the flag signal is ON. Thereafter, the semiconductor memory device of Embodiment 7 changes the bias voltages of the memory cell MS0 in accordance with an output of the flag circuit 5 to change the charge localized portions which are used to store data, thereby preventing programming or erasing of data from being disabled due to the endurance degradation. Note that, in the semiconductor memory device of Embodiment 7, an operation of changing the bias voltages can be performed using the method of Embodiment 2 described with reference to FIG. 7, or the like.

Note that, in the semiconductor memory device of Embodiment 7, a portion of the non-volatile memory cells can be used as the counter circuits. By using memory cells as counter circuits, it is possible to prevent programming or erasing of data from being disabled due to the endurance degradation without additionally providing a circuit. However, when the semiconductor memory device is applied to a flash memory, since reprogramming cannot be performed on a bit-by-bit basis in the flash memory, a counter circuit needs to be additionally programmed every reprogram operation.

Therefore, in the semiconductor memory device of Embodiment 7, each counter circuit may be composed of a plurality of small-size memory sectors including a predetermined number of memory cells. In this configuration, the small-size memory sectors are caused to count different digits. When a carry occurs in a memory sector at a lower digit, one bit is programmed into a memory sector at an upper digit, and the lower-digit memory sector is erased. With this method, the number of times of reprogramming can be counted without additionally reprogramming a counter circuit.

Figure 13:
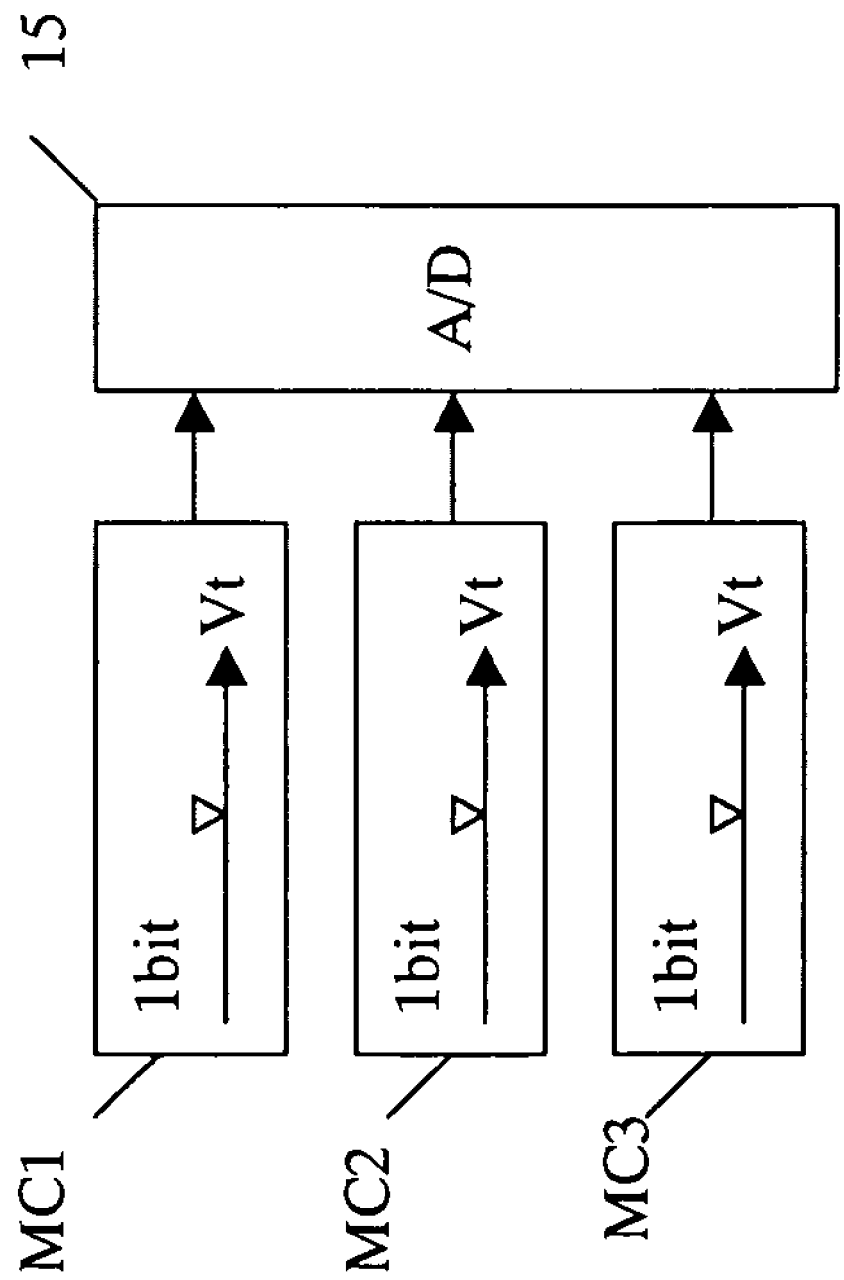
FIG. 13 is a conceptual diagram illustrating another example of the counter circuit of Embodiment 7 of the present invention.

FIG. 13 is a conceptual diagram illustrating another example of the counter circuit of Embodiment 7 of the present invention. The counter circuit includes memory cells MC1 to MC3, and an A/D converter 15. The memory cells MC1 to MC3 each change the threshold voltage Vt by performing a program operation little by little every time the number of times of reprogramming is increased. Thereafter, the threshold voltage Vt of the memory cell is converted into the number of times of reprogramming by the A/D converter 15. In this case, the number of times of reprogramming does not need to be correctly known and may be roughly known. Therefore, a variation in Vt by one reprogram operation may be small. Thus, by changing the threshold voltage Vt of a memory cell, the number of times of reprogramming can be counted. The method may be combined with different digits or a carry process described above, thereby making it possible to count a larger number. Thus, by using the threshold voltage Vt of a memory cell to count, the number of memory cells used for a counter circuit can be reduced, thereby making it possible to save the chip area.

With the above-described configuration, the semiconductor memory device of Embodiment 7 can prevent programming or erasing of data from being disabled due to the endurance degradation, and since two charge localized portions are changed to use, the number of times of reprogramming guaranteed can be doubled.

Embodiment 8

Figure 14:
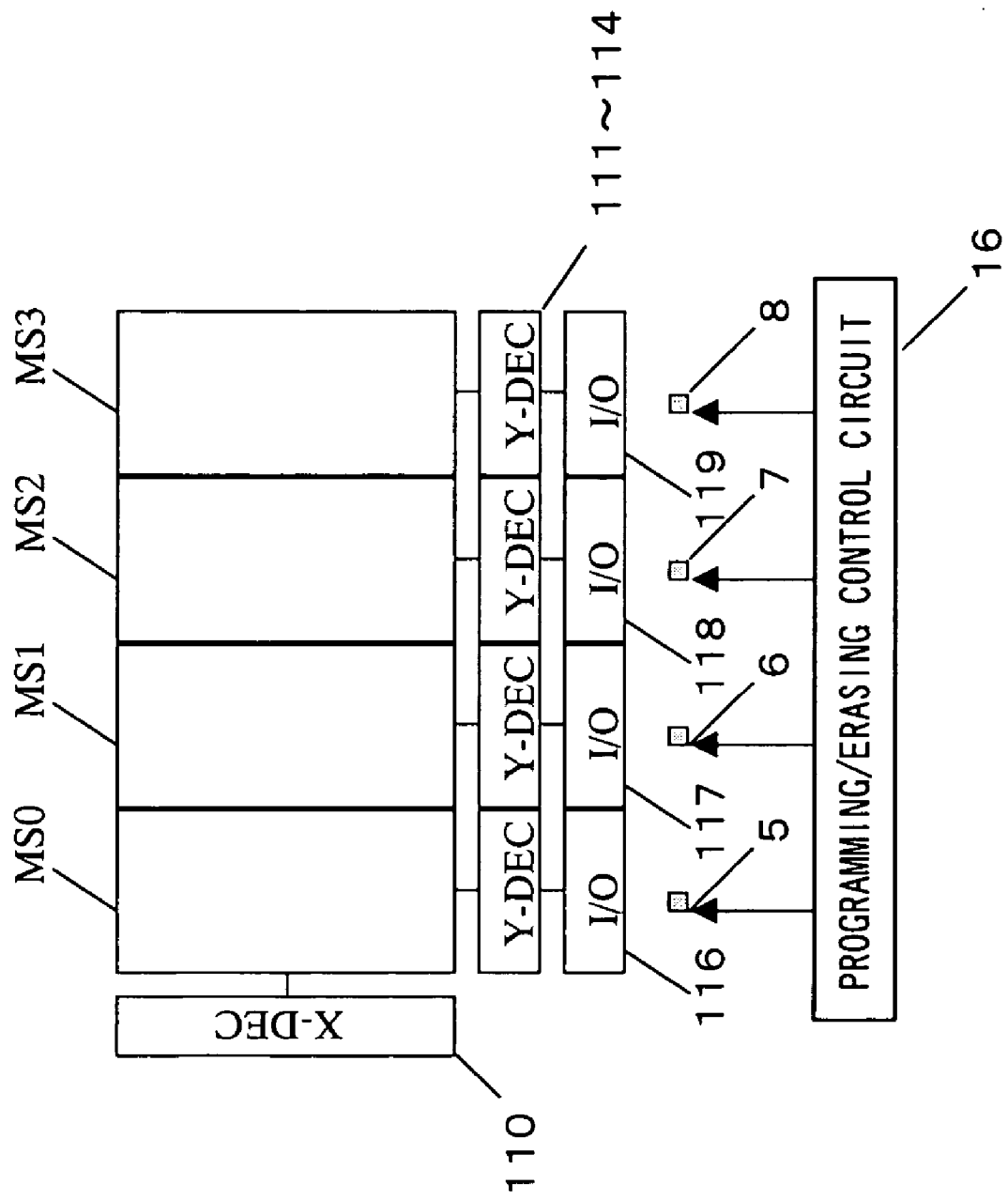
FIG. 14 is a schematic diagram illustrating a whole semiconductor memory device according to Embodiment 8 of the present invention.

FIG. 14 is a schematic diagram illustrating a whole semiconductor memory device according to Embodiment 8 of the present invention. The semiconductor memory device of Embodiment 8 is a variation of Embodiment 7. Therefore, a difference therebetween will be hereinafter described, and the same parts will not be described. Also in FIG. 14, the same reference characters as those of Embodiments 1 and 2 indicate the same parts.

The semiconductor memory device of Embodiment 8 controls a memory cell by detecting the endurance degradation of the memory cell using a programming/erasing control circuit, but not by managing the number of times of reprogramming using a counter circuit.

The semiconductor memory device of Embodiment 8 is characterized by comprising the flag circuits 5 to 8 provided for the memory sectors MS0 to MS3, respectively, and a programming/erasing control circuit connected to the flag circuits.

The semiconductor memory device of Embodiment 8 is shipped in a state that each flag circuit does not change the charge localized portions which store data. When the programming/erasing control circuit 16 detects the following predetermined phenomenon: a time at which a program or erase operation is completed exceeds a specification; a bias voltage at the time of executing a program or erase operation deviates from a predetermined value; or the like, during a program or erase operation with respect to the respective corresponding memory sectors, the programming/erasing control circuit 16 sets a flag to be ON in a flag circuit of a memory sector in which the problematic phenomenon occurs.

For example, when the programming/erasing control circuit 16 detects that the program time of a specific memory sector included in the memory sector MS0 exceeds the predetermined time, the programming/erasing control circuit 16 performs a program operation with respect to the flag circuit 5 to set a flag signal to be ON. Thereafter, the semiconductor memory device of Embodiment 8 changes the bias voltages of the memory cell MS0 in accordance with an output of the flag circuit 5 to change the charge localized portions which store data, thereby preventing programming or erasing of data from being disabled due to the endurance degradation. Note that, in the semiconductor memory device of Embodiment 8, an operation of changing the bias voltages can be performed using the method of Embodiment 2 described with reference to FIG. 7, or the like. Note that the other memory sectors perform the same operation.

With the above-described configuration, the semiconductor memory device of Embodiment 8 can prevent programming or erasing of data from being disabled due to the endurance degradation, and since two charge localized portions are changed to use, the number of times of reprogramming guaranteed can be doubled. Particularly, the semiconductor memory device of Embodiment 8 detects the state of each memory cell, thereby effectively taking measures against a variation in characteristics of a memory cell. Also, the semiconductor memory device of Embodiment 8 is effective to not only prevention of programming or erasing of data from being disabled due to the endurance degradation, but also a problem that static charge which is stored for a long period in a charge localized portion is lost (retention failure).

Embodiment 9

Next, a semiconductor memory device according to Embodiment 9 of the present invention will be described. The semiconductor memory device of Embodiment 9 has substantially the same configuration as that of the semiconductor memory device of Embodiment 1. In the semiconductor memory device of Embodiment 9, an error correct code (ECC) is stored in the charge localized portion 106 which is not normally used to store data of a predetermined memory cell.

The ECC refers to redundant data which is added separately from original data so as to correct an error in the original data when static charge is read out, assuming that the static charge, which was stored in the charge localized portion 107, is lost. The semiconductor memory device of Embodiment 9 generates and stores the ECC into the charge localized portion 106 for fear that, when data is read out by accessing the charge localized portion 107 of a memory cell in any of the memory sectors, the read operation is disabled due to a defect in the charge localized portion 107.

With the above-described configuration, the semiconductor memory device of Embodiment 9 can hold the ECC without additionally providing a part, such as a memory cell or the like, for holding the ECC. Therefore, the semiconductor memory device of Embodiment 9 can improve a semiconductor memory device function without increasing the chip area.

Embodiment 10

Next, a semiconductor memory device according to Embodiment 10 of the present invention will be described. The semiconductor memory device of Embodiment 10 has substantially the same configuration as that of the semiconductor memory device of Embodiment 1. In the semiconductor memory device of Embodiment 10, the charge localized portion 106 which is not normally used to store data of a predetermined memory cell is used as a temporary area for temporarily programming data.

Typically, in a flash memory, all data is simultaneously erased in each memory sector, and therefore, if the whole memory sector is not erased, new data cannot be programmed into the memory sector. However, for example, when a large amount of communication data is received, the erase time is a time lag, so that programming and erasing of a memory cannot be performed in time. Therefore, when data stored in the charge localized portion 107 is erased and programmed, the semiconductor memory device of Embodiment 10 stores the data into the charge localized portion 106. Thereafter, the semiconductor memory device of Embodiment 10 erases data in the charge localized portion 107 and removes charge from the charge localized portion 107, and thereafter, reads the data programmed in the charge localized portion 106.

With the above-described configuration, the semiconductor memory device of Embodiment 10 does not need to spend a waiting time for erasing data before reprogramming data, and can process a rush of reprogram commands.

The present invention can be applied to general apparatuses which use a non-volatile semiconductor memory device, such as a program memory for a mobile apparatus (e.g., a mobile telephone terminal, etc.), a data memory for a digital camera, or the like.

While the invention has been described in detail, the foregoing description is in all aspects illustrative and not restrictive. It is understood that numerous other modifications and variations can be devised without departing from the scope of the invention.

What is claimed is:

1. A non-volatile semiconductor memory device operable to program and erase data, and hold the data in the absence of a supplied voltage, comprising:
   a memory cell including a first charge localized portion and a second charge localized portion each operable to store static charge corresponding to the data; and
   a flag circuit for outputting a flag signal to switch between the charge localized portions, wherein
   the memory cell stores static charge in either one of the first and second charge localized portions to hold the data,
   when the first charge localized portion does not have a production defect, the first charge localized portion stores the static charge to hold the data, and
   when the first charge localized portion has difficulty in storing the static charge due to the production defect, a charge localized portion to be read and written is changed from the first charge localized portion to the second charge localized portion in accordance with an output of the flag circuit, irrespective of an address signal inputted from outside of the semiconductor memory device, and the second charge localized portion stores static charge corresponding to static charge which should be stored in the first charge localized portion, thereby serving as a backup to the first charge localized portion, wherein the semiconductor memory device further comprises:

a first bit line connected to a drain of the memory cell;

a second bit line connected to a source of the memory cell;

a first power supply line for supplying a first power supply voltage;

a second power supply line for supplying a second power supply voltage;

a first switch element for switching between a connection of the first bit line with the first power supply line and a connection of the first bit line with the second power supply line; and a second switch element for switching between a connection of the second bit line with the second power supply line and a connection of the second bit line with the first power supply line, wherein a potential of the first power supply voltage is different from a potential of the second power supply voltage, and the first switch element and the second switch element are controlled such that power supply voltages supplied between the source and the drain of the memory cell are reversed based on the flag signal output from the flag circuit.

2. The semiconductor memory device according to claim 1, comprising a plurality of the memory cells, wherein the charge localized portions in all the plurality of the memory cells are changed.

3. The semiconductor memory device according to claim 1, wherein the flag circuit includes an electrically-reprogrammable non-volatile memory and a latch circuit.

* * * * *